(12) United States Patent
Ariji et al.

(10) Patent No.: US 9,735,756 B2
(45) Date of Patent: Aug. 15, 2017

(54) PIEZOELECTRIC DEVICE

(71) Applicant: NIHON DEMPA KOGYO CO., LTD., Tokyo (JP)

(72) Inventors: Takumi Ariji, Saitama (JP); Kunio Morita, Saitama (JP); Tomoyuki Ochiai, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 502 days.

(21) Appl. No.: 14/555,684

(22) Filed: Nov. 27, 2014

(65) Prior Publication Data
US 2015/0155469 A1   Jun. 4, 2015

(30) Foreign Application Priority Data

Dec. 2, 2013 (JP) ................................ 2013-249461
Jan. 24, 2014 (JP) ................................ 2014-011451

(51) Int. Cl.
| | |
|---|---|
| *H01L 41/09* | (2006.01) |
| *H03H 9/19* | (2006.01) |
| *H03H 9/10* | (2006.01) |
| *H03H 9/05* | (2006.01) |
| *H03H 9/17* | (2006.01) |

(52) U.S. Cl.
CPC ........ *H03H 9/1021* (2013.01); *H03H 9/0595* (2013.01); *H03H 9/1035* (2013.01); *H03H 9/17* (2013.01)

(58) Field of Classification Search
CPC .. H03H 9/1021; H03H 9/0595; H03H 9/1035; H03H 9/17

USPC ......................................... 310/344, 363, 364
See application file for complete search history.

(56) References Cited

U.S. PATENT DOCUMENTS

| | | | |
|---|---|---|---|
| 2009/0108709 A1* | 4/2009 | Tsuchido | ............. H03H 9/0595 310/364 |
| 2013/0033153 A1* | 2/2013 | Mizusawa | ............... H03H 9/171 310/348 |

FOREIGN PATENT DOCUMENTS

| | | | | |
|---|---|---|---|---|
| JP | 2013-017163 | | 1/2013 | |
| JP | WO 2015/190261 A1 * | | 12/2015 | ............. H01L 23/10 |
| WO | 2007023685 | | 3/2007 | |

* cited by examiner

*Primary Examiner* — Thomas Dougherty
(74) *Attorney, Agent, or Firm* — Jianq Chyun IP Office

(57) ABSTRACT

A piezoelectric device includes a piezoelectric vibrating piece and a base. The piezoelectric vibrating piece includes an excitation portion, a framing portion, a connecting portion, excitation electrodes, and extraction electrodes. The base includes a mounting terminal, a cutout portion formed on a side surface, and a cutout-portion electrode formed in the cutout portion. The cutout-portion electrode connects the mounting terminal to the extraction electrode. The extraction electrode includes a cutout-portion region connected to the cutout-portion electrode, an excitation-electrode connecting region connected to the excitation electrode, and an erosion preventing region disposed between the cutout-portion region and the excitation-electrode connecting region to prevent erosion by solder. The extraction electrode in the erosion preventing region is formed without containing gold (Au) and silver (Ag), and the extraction electrodes in the cutout-portion region and the excitation-electrode connecting region are formed containing at least one of gold (Au) and silver (Ag).

8 Claims, 14 Drawing Sheets

PIEZOELECTRIC DEVICE

CROSS REFERENCE TO RELATED APPLICATIONS

This application claims the priority benefit of Japan application serial no. 2013-249461 filed on Dec. 2, 2013, and Japan application serial no. 2014-011451, filed on Jan. 24, 2014. The entirety of each of the above-mentioned patent applications is hereby incorporated by reference herein and made a part of this specification.

TECHNICAL FIELD

This disclosure relates to a piezoelectric device. In particular, this disclosure relates to a piezoelectric device for reducing erosion by solder.

DESCRIPTION OF THE RELATED ART

Piezoelectric devices are widely used to mainly select or control frequencies in various electronic equipment such as a mobile phone and a personal computer. The piezoelectric devices can be categorized into a piezoelectric resonator, a piezoelectric oscillator, a SAW device, an optical device, and similar device based on the functions. A crystal unit, a crystal oscillator, and similar device using crystal as a piezoelectric element are widely known and generally used.

Here, as the crystal unit, for example, Japanese Unexamined Patent Application Publication No. 2013-017163 discloses the following device. Firstly, there is provided a vibrating portion and a framing portion. In the vibrating portion, excitation electrodes are formed on both principal surfaces. The framing portion connects to the vibrating portion and surrounds the peripheral area of the vibrating portion. To the framing portion, a plate-shaped base is bonded. On the side surface of the base, cutout portions are formed. On the back side (the opposite surface to the surface bonded to the framing portion) of the base, mounting terminals are formed. Here, from the excitation electrode, an extraction electrode is formed to extend up to the framing portion. The extraction electrode extends up to the region facing the cutout portion of the base. The mounting terminal is electrically conducted to the extraction electrode via the electrode formed on the side surface of the cutout portion.

However, in the case where the crystal unit has been mounted on the substrate using solder, this solder erodes the extraction electrode and might reach the excitation electrode.

A need thus exists for a piezoelectric device which is not susceptible to the drawback mentioned above.

SUMMARY

A piezoelectric device according to a first aspect of this disclosure includes a piezoelectric vibrating piece, extraction electrodes, and a base. The piezoelectric vibrating piece is formed of a piezoelectric material. The piezoelectric vibrating piece includes an excitation portion and excitation electrodes formed on both principal surfaces of the excitation portion. The extraction electrodes are extracted from the excitation electrodes. The base includes: a cutout portion formed on a side surface of the base; a mounting terminal formed on a principal surface on an opposite side of the principal surface where the piezoelectric vibrating piece is placed; and a cutout-portion electrode formed in the cutout portion. The cutout-portion electrode connects the extraction electrodes to the mounting terminal. The extraction electrode includes: a cutout-portion region connected to the cutout-portion electrode; an excitation-electrode connecting region connected to the excitation electrode; and an erosion preventing region disposed between the cutout-portion region and the excitation-electrode connecting region to prevent erosion by solder. The extraction electrode in the erosion preventing region is formed without containing gold (Au) and silver (Ag), and the extraction electrodes in the cutout-portion region and the excitation-electrode connecting region are formed containing at least one of gold (Au) and silver (Ag).

BRIEF DESCRIPTION OF THE DRAWINGS

The foregoing and additional features and characteristics of this disclosure will become more apparent from the following detailed description considered with reference to the accompanying drawings.

FIG. 10C is a partially enlarged cross-sectional view of a piezoelectric device 100a.

DETAILED DESCRIPTION

The following description describes embodiments of this disclosure in detail with reference to the accompanying drawings. It will be understood that the scope of the disclosure is not limited to the following embodiments, unless otherwise stated.

[Overall Configuration of Piezoelectric Device 100 of First Embodiment]

Figure 1:
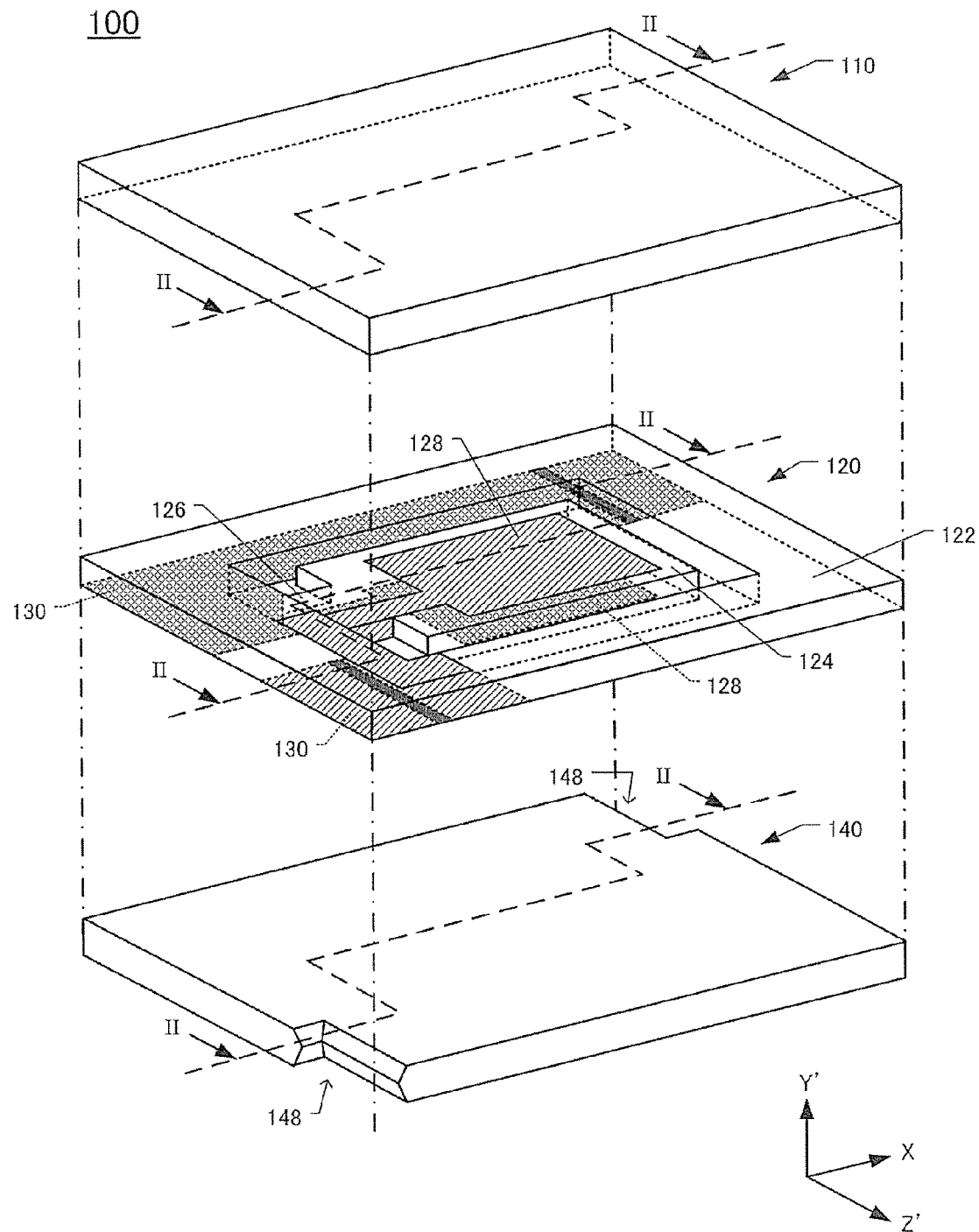
FIG. 1 is an exploded perspective view of a piezoelectric device 100.

FIG. 1 is an exploded perspective view of a piezoelectric device 100. The piezoelectric device 100 is a piezoelectric resonator that has a rectangular parallelepiped outer shape. As illustrated in FIG. 1, the piezoelectric device 100 has a configuration where a base 140, a framed piezoelectric vibrating piece 120, and a lid 110 are laminated together. For example, an AT-cut quartz-crystal vibrating piece is used as the piezoelectric vibrating piece 120. The AT-cut quartz-crystal vibrating piece has a principal surface (Y-Z plane) that is tilted by 35° 15' about the Y-axis of crystallographic axes (XYZ) in the direction from the Z-axis to the Y-axis around the X-axis. In the following description, the Y'-axis and the Z'-axis indicate new axes tilted with reference to the axis directions of the AT-cut quartz-crystal vibrating piece. In other words, in the piezoelectric device 100, this disclosure defines the longitudinal side direction of the piezoelectric device 100 as the X-axis direction, the height direction of the piezoelectric device 100 as the Y'-axis direction, and the direction perpendicular to the X-axis direction and Y'-axis direction as the Z'-axis direction.

The framed piezoelectric vibrating piece 120 includes a rectangular vibrating portion 124 (which is also referred to as excitation portion) in the center. On the outside of the vibrating portion 124, a framing portion 122 is disposed. The framing portion 122 surrounds the vibrating portion 124 at a distance from the vibrating portion 124. The vibrating portion 124 and the framing portion 122 are connected together by a connecting portion 126. The connecting portion 126 extends from the −X-axis side of the vibrating portion 124 in the −X-axis direction and reaches the framing portion 122.

On the surfaces at the +Y'-axis side and the surface at the −Y'-axis side that are both principal surfaces of the vibrating portion 124, as illustrated in FIG. 1, excitation electrodes 128 facing each other are formed. From the respective excitation electrodes 128, extraction electrodes 130 are extracted to the framing portion 122 via the connecting portion 126.

The base 140 is formed in a flat plate shape, and is bonded to the surface at the −Y'-axis side of the framing portion 122. The base 140 is arranged to face the vibrating portion 124. The base 140 is formed using glass, crystal or similar material as the base material. At the corner of the +Z-axis side on the −X-axis side and at the corner of the −Z'-axis side on the +X-axis side in the base 140, cutout portions 148 are formed. The cutout portion 148 is formed by cutting out the corner of the base 140. Although electrodes are formed in the base 140, the electrodes are not illustrated in FIG. 1. The electrodes formed in the base 140 will be described in FIG. 2, FIG. 4, FIG. 5A, and FIG. 5B.

The lid 110 is formed in a flat plate shape, and is bonded to the surface at the +Y'-axis side of the framing portion 122. The lid 110 is arranged to face the vibrating portion 124. The lid 110 is formed of glass, crystal, or similar material.

Figure 2:
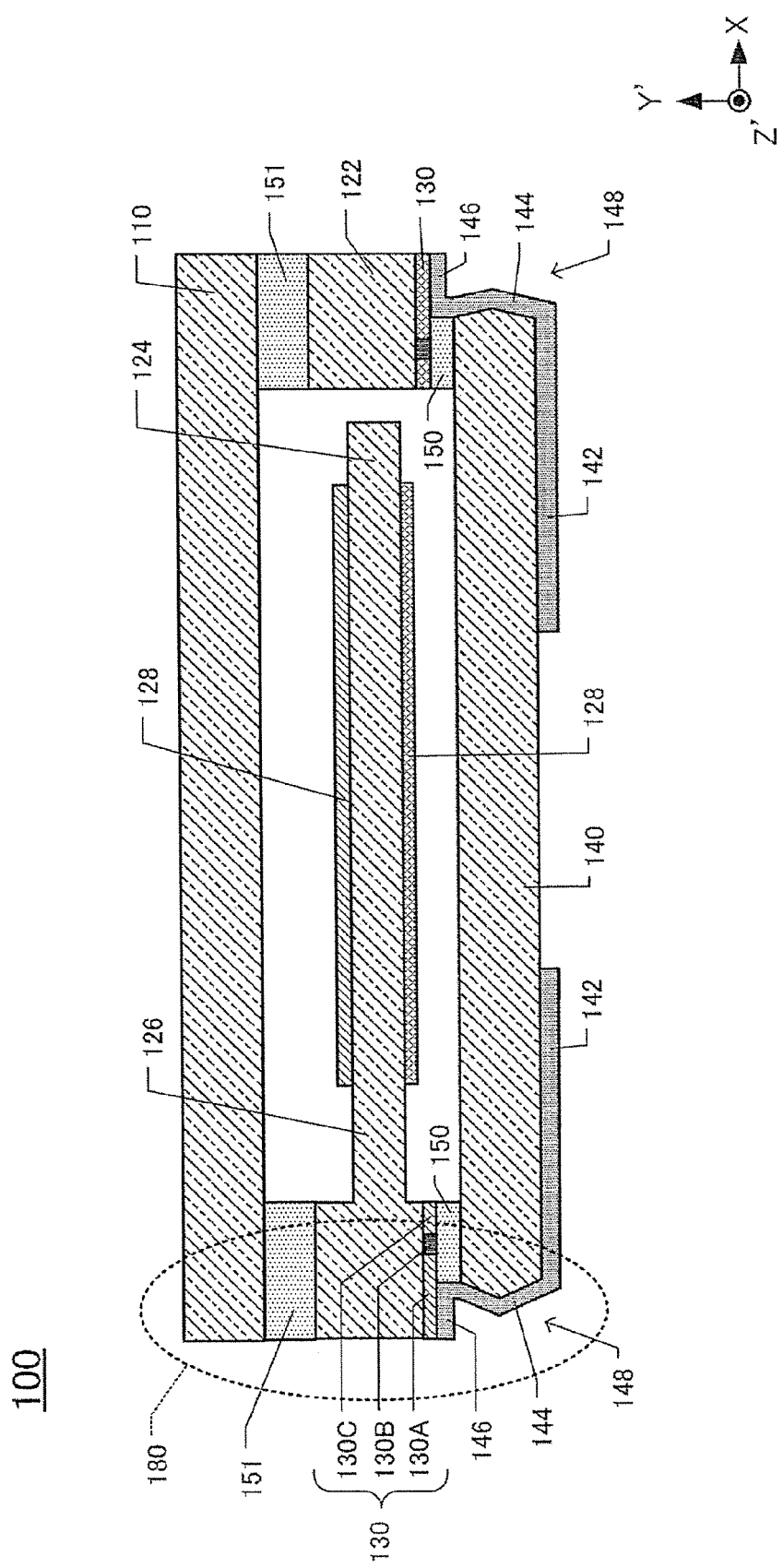
FIG. 2 is a cross-sectional view taken along the line II-II in FIG. 1.

FIG. 2 is a cross-sectional view taken along the line II-II in FIG. 1. The lid 110 and the framing portion 122 are bonded together by a non-conductive bonding material 151 such as a resin adhesive such as polyimide, or low-melting-point glass. The base 140 and the framing portion 122 are bonded together by a non-conductive bonding material 150 such as a resin adhesive such as polyimide, or low-melting-point glass. Thus, the vibrating portion 124 is hermetically-sealed in the space enclosed by the lid 110, the framing portion 122, and the base 140. To adjust the frequency of the piezoelectric device 100, the vibrating portion 124 is formed thinner than the framing portion 122 such that the vibrating portion 124 does not contact to the lid 110 and the base 140.

On the surface at the −Y'-axis side of the base 140, a pair of mounting terminals 142 are formed. On the side surface of the cutout portion 148, cutout-portion electrodes 144 are formed. End-portion electrodes 146 are formed to connect to the extraction electrodes 130. One of the mounting terminals 142 is formed at the +X-axis side of the base 140. The other mounting terminal 142 is formed at the −X-axis side of the base 140. The respective mounting terminals 142 extend to the cutout portions 148 and connect to the cutout-portion electrodes 144. The cutout-portion electrode 144 extends to the surface at the −Y'-axis side of the framing portion 122 and connects to the end-portion electrode 146. Accordingly, the mounting terminals 142 are electrically connected to the excitation electrodes 128

Figure 3A:
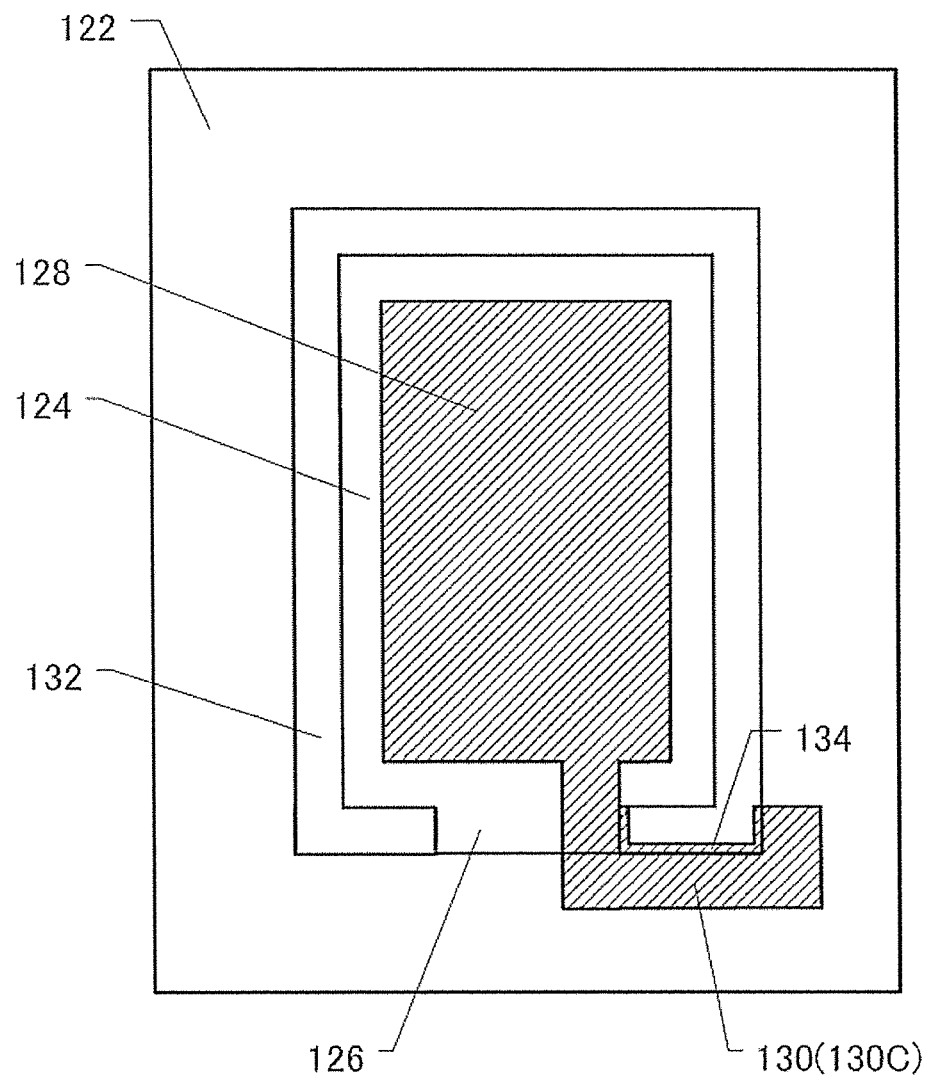
FIG. 3A is a top view of a piezoelectric vibrating piece 120.

FIG. 3A is a top view of the piezoelectric vibrating piece 120. Between the vibrating portion 124 and the framing portion 122, a through groove 132 is formed. The through groove 132 passes through the piezoelectric vibrating piece 120 in the Y' axis direction. The vibrating portion 124 and the framing portion 122 are connected together via the connecting portion 126. In the vibrating portion 124, the excitation electrode 128 is formed. From the excitation electrode 128, the extraction electrode 130 is extracted to the framing portion 122 via the connecting portion 126. The extraction electrode 130 is extracted to the surface at the −Y'-axis side of the framing portion 122 via a side surface 134 of the through groove 132.

Figure 3B:
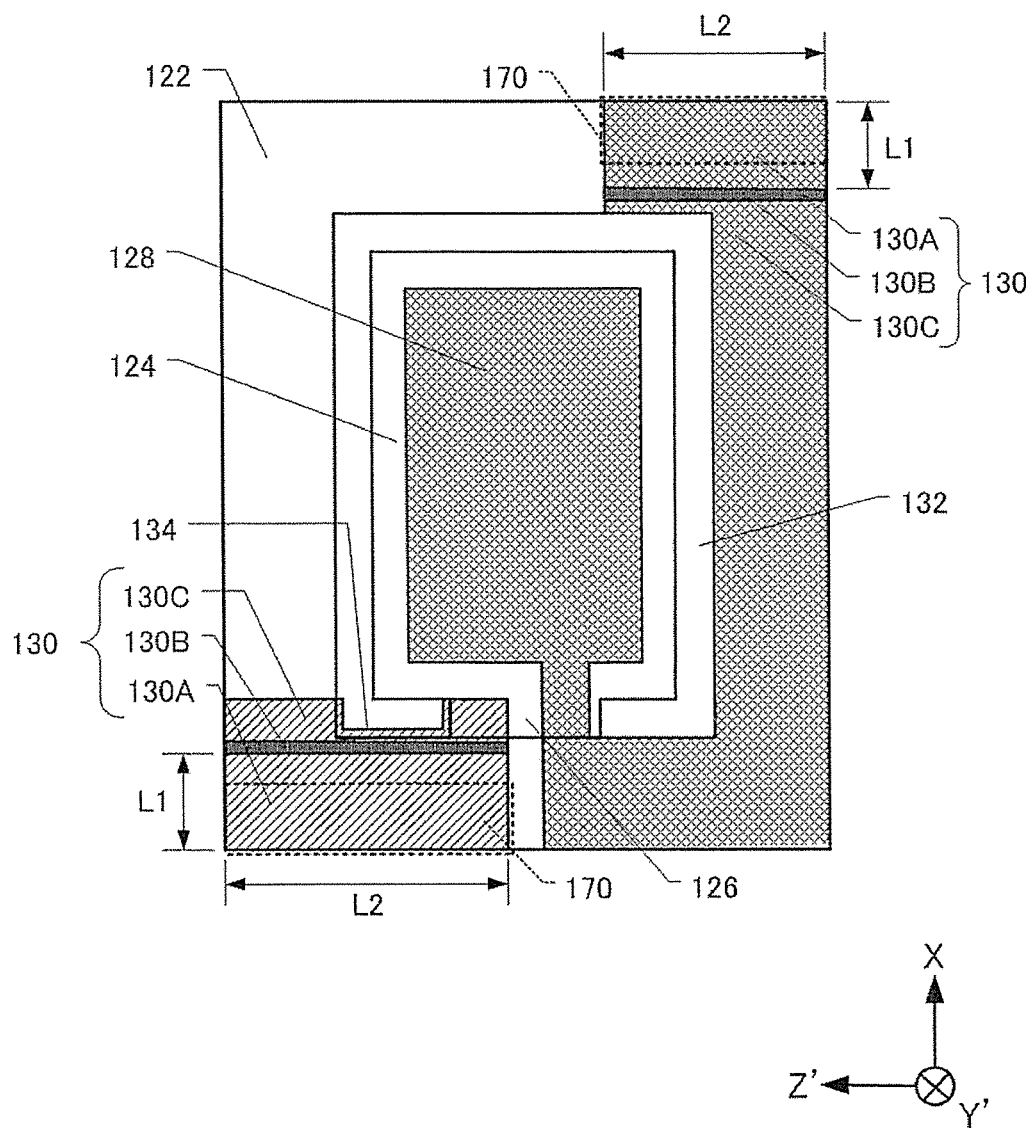
FIG. 3B is a bottom view of the piezoelectric vibrating piece 120.

FIG. 3B is a bottom view of the piezoelectric vibrating piece 120. From the excitation electrode 128 formed on the surface at the −Y'-axis side, the extraction electrode 130 is extracted. The extraction electrode 130 extends from the excitation electrode 128 on the surface at the −Y'-axis side in the −X-axis direction, passes through the portion at the −X-axis side and the −Z'-axis side of the framing portion 122, and extends to the corner portion at the −Z'-axis side and the +X-axis side on the surface of the framing portion 122 at the −Y'-axis side.

The extraction electrode 130 extracted from the excitation electrode 128 formed on the surface at the +Y'-axis side is extracted to the surface at the −Y'-axis side of the framing portion 122 via the side surface 134 of the through groove 132. The extraction electrode 130 extracted to the surface at the −Y'-axis side extends to the corner portion at the +Z-axis side and the −X-axis side on the surface at the −Y'-axis side of the framing portion 122.

A part of the framing portion 122 faces the cutout portion 148 of the base 140 when being connected to the base 140 (see FIG. 2). FIG. 3B illustrates cutout-portion facing regions 170 that are the regions facing the cutout portions 148 in the framing portion 122. In at least a part of the cutout-portion facing regions 170 of the framing portion 122, the respective extraction electrodes 130 are formed.

A description will be given of the extraction electrode 130 by being divided into three regions of a cutout-portion region 130A, an erosion preventing region 130B, and an excitation-electrode connecting region 130C. The cutout-portion region 130A is a region that includes the cutout-portion facing region 170 facing the cutout portion 148 of the base 140. The excitation-electrode connecting region 130C is a region connected to the excitation electrode 128. The erosion preventing region 130B is a region formed between the cutout-portion region 130A and the excitation-electrode connecting region 130C, and is formed to separate the cutout-portion region 130A and the excitation-electrode connecting region 130C form each other. Here, the excitation-electrode connecting region 130C also includes the extraction electrode 130 connected to the excitation electrode 128 illustrated in FIG. 3A.

In the cutout-portion region 130A formed on the surface at the −Y'-axis side of the framing portion 122, the length in the Z' axis direction is L2 and the length in the X-axis direction is L1. In the piezoelectric vibrating piece 120, L2 is equal to L4 in FIG. 4 described below. L1 is larger than L3 in FIG. 4.

Figure 4:
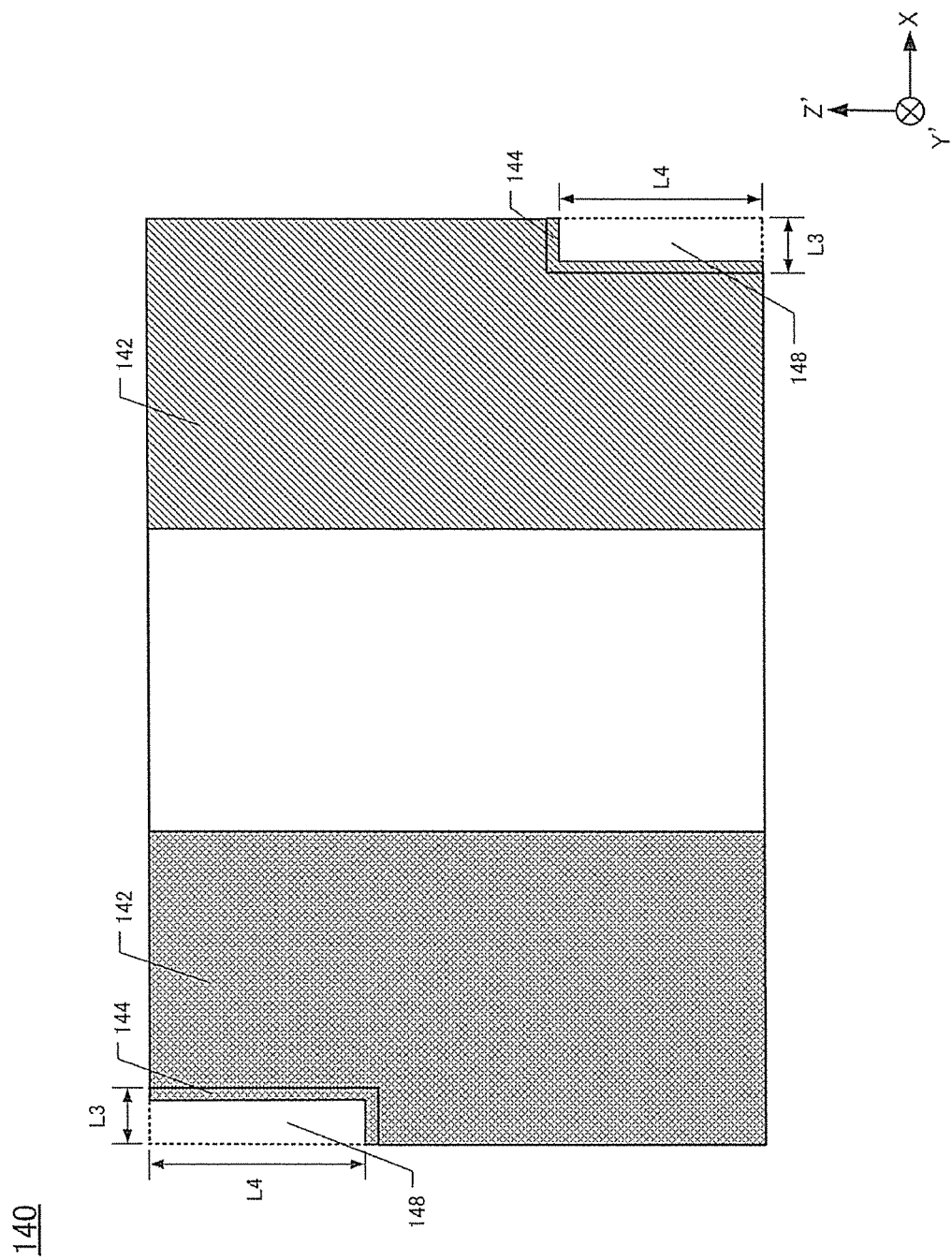
FIG. 4 is a bottom view of a base 140.

FIG. 4 is a bottom view of the base 140. In the base 140, the principal surfaces are formed in an approximately rectangular shape, and the cutout portions 148 are formed at the corner of the +Z-axis side on the −X-axis side and at the corner of the −Z'-axis side on the +X-axis side. At the +X-axis side and the −X-axis side on the surface at the −Y'-axis side of the base 140, the respective mounting terminals 142 are formed. On the side surface of the cutout portion 148, the cutout-portion electrode 144 is formed. For the size of the X-Z' plane of the cutout portion 148, assuming that the length in the Z' axis direction is L4 and the length in the X direction is L3, for example, L3 is 0.08 mm and L4 is 0.4 mm.

[Electrodes of Piezoelectric Device 100]

Figure 5A:
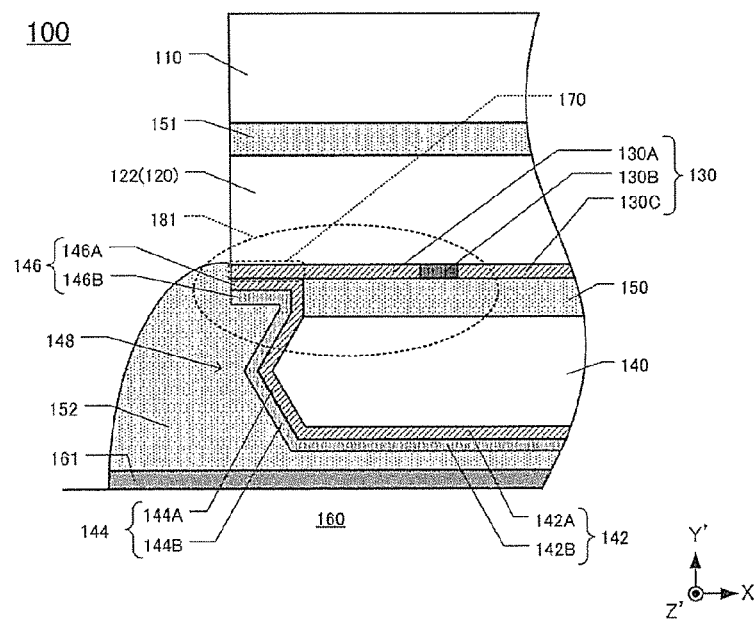
FIG. 5A is a partially enlarged cross-sectional view of the piezoelectric device 100.

FIG. 5A is a partially enlarged cross-sectional view of the piezoelectric device 100. FIG. 5A illustrates a region enclosed by a dotted line 180 in FIG. 2. FIG. 5A illustrates a cross-sectional view of the state where the piezoelectric device 100 is placed on a substrate 160. The following description describes the extraction electrode 130 and electrical conduction of the extraction electrode 130 with the mounting terminals 142, with reference to FIG. 5A.

The piezoelectric device 100 is used by, for example, being mounted on the substrate 160. In this case, the mounting terminal 142 of the piezoelectric device 100 is bonded to a substrate electrode 161 formed on the substrate 160 via a solder 152, so as to be electrically connected together. As illustrated in FIG. 5A, the solder 152 might be brought into contact with the cutout-portion electrode 144, the end-portion electrode 146, and the extraction electrode 130 depending on wettability of the solder 152.

The mounting terminal 142 is formed of two layers of a mounting terminal 142A and a mounting terminal 142B. The mounting terminal 142A is formed on the base material of the base 140. The mounting terminal 142B is formed on the surface of the mounting terminal 142A. The cutout-portion electrode 144 includes two layers of a cutout-portion electrode 144A and a cutout-portion electrode 144B formed on the surface of the cutout-portion electrode 144A. The end-portion electrode 146 includes two layers of an end-portion electrode 146A and an end-portion electrode 146B formed on the surface of the end-portion electrode 146A. The end-portion electrode 146 connects to the cutout-portion region 130A of the extraction electrode 130 for red in the cutout-portion facing region 170 that faces the cutout portion 148 of the framing portion 122.

The mounting terminal 142A, the cutout-portion electrode 144A, and the end-portion electrode 146A are integrally formed. The mounting terminal 142B, the cutout-portion electrode 144B, and the end-portion electrode 146B are integrally formed. The mounting terminal 142A, the cutout-portion electrode 144A, and the end-portion electrode 146A are formed by sputtering, evaporation, or similar method. The mounting terminal 142B, the cutout-portion electrode 144B and the end-portion electrode 146B are formed by electroless plating. The mounting terminal 142B, the cutout-portion electrode 144B and the end-portion electrode 146B are formed thicker than the mounting terminal 142A, the cutout-portion electrode 144A, and the end-portion electrode 146A. Accordingly, the mounting terminal 142, the cutout-portion electrode 144, and the end-portion electrode 146 are entirely formed to be thick. This prevents disconnection between the mounting terminal 142 and the extraction electrode 130, thus ensuring the electrical conduction.

Figure 5B:
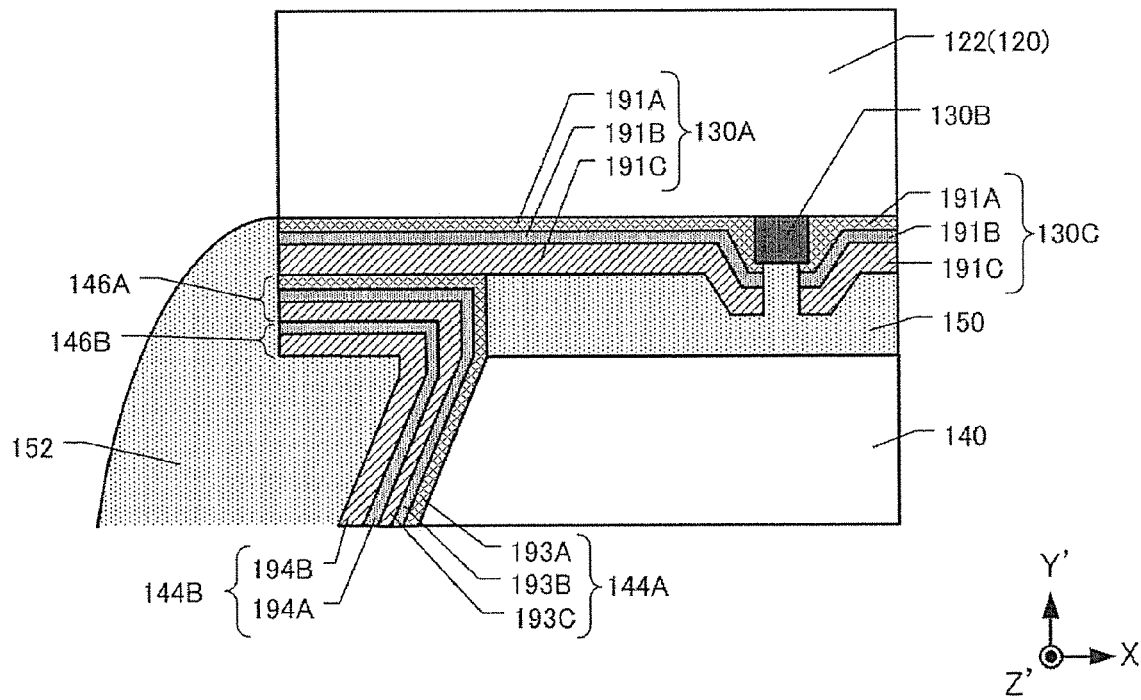
FIG. 5B is an enlarged view of a region enclosed by a dotted line 181 in FIG. 5A.

FIG. 5B is an enlarged view of a region enclosed by a dotted line 181 in FIG. 5A. Further, the cutout-portion electrode 144A includes three layers. For the layer in contact with the base material of the base 140, a first layer 193A of the cutout-portion electrode 144A is formed, for example, as a chromium (Cr) layer. A second layer 193B formed on the surface of the first layer 193A is formed as a nickel-tungsten (NiW) layer, which is the alloy of nickel (Ni) and tungsten (W). A third layer 193C formed on the surface of the second layer 193B is formed as a gold (Au) layer. The mounting terminal 142A and the end-portion electrode 146A are formed integrally with the cutout-portion electrode 144A. Accordingly, the mounting terminal 142A and the end-portion electrode 146A are formed of the first layer 193A, the second layer 193B, and the third layer 193C similarly to the cutout-portion electrode 144A.

The cutout-portion electrode 144B includes two layers. For the layer formed in contact with the surface of the cutout-portion electrode 144A, a first layer 194A of the cutout-portion electrode 144B is formed as a nickel (Ni) layer. A second layer 194B formed on the surface of the first layer 194A is formed as a gold (Au) layer. The second layer 194B is exposed on the surface of the cutout-portion electrode 144. The mounting terminal 142B and the end-portion electrode 146B are formed integrally with the cutout-portion electrode 144B. Accordingly, the mounting terminal 142B and the end-portion electrode 146B are also formed of the first layer 194A and the second layer 194B similarly to the cutout-portion electrode 144B.

The cutout-portion region 130A and the excitation-electrode connecting region 130C of the extraction electrode 130 each include three layers. A chromium (Cr) layer is formed as a first layer 191A on the surface of the crystal, which is the base material of the piezoelectric vibrating piece 120. A second layer 191B formed on the surface of the first layer 191A is formed as a nickel-tungsten (NiW) layer, which is the alloy of nickel (Ni) and tungsten (W). A third layer 191C formed on the surface of the second layer 191B is formed as a gold (Au) layer. On the other hand, the erosion preventing region 130B includes chrome (Cr) alone. Here, a nickel-tungsten (NiW) layer as an alloy of nickel (Ni) and tungsten (W) may be formed on the surface of chrome (Cr).

The erosion preventing region 130B has strong bond strength with the crystal the base material of the piezoelectric vibrating piece 120, is less likely to be eroded by the solder 152, and can be formed of metal having a conductive property. Accordingly, for example, the erosion preventing region 130B may be formed by nickel (Ni), tungsten (W), nickel-tungsten (NiW), molybdenum (Mo), titanium (Ti), or similar material instead of chrome (Cr).

In the layers of: the third layer 191C of the cutout-portion region 130A and the excitation-electrode connecting region 130C; the third layer 193C of the mounting terminal 142A, the end-portion electrode 146A, and the cutout-portion electrode 144A; and the second layer 194B of the mounting terminal 142B, the end-portion electrode 146B, and the cutout-portion electrode 144B, a silver (Ag) layer may be formed using silver (Ag) instead of gold (Au) or a layer formed of an alloy of gold (Au), silver (Ag), and palladium (Pd) may be formed.

Here, the excitation electrode 128 is also formed of three layers similar to those in the cutout-portion region 130A and the excitation-electrode connecting region 130C of the extraction electrode 130. That is, the excitation electrode 128 is formed of the first layer 191A as the chromium (Cr) layer, the second layer 191B as the nickel-tungsten (NiW) layer, and the third layer 191C as the gold (Au) layer.

[Method for Mounting Piezoelectric Device 100 on Substrate 160]

The piezoelectric device 100 is used by being mounted on the substrate 160 as illustrated in FIG. 5A. This mounting is performed as follows. Firstly, the substrate 160 where the substrate electrode 161 is formed is prepared. Subsequently, the paste of the solder 152 is applied over the surface of the substrate electrode 161. Subsequently, the piezoelectric device 100 is placed on the substrate 160 to bring the mounting terminal 142 into contact on the paste of the solder 152. Subsequently, at least the paste of the solder 152 is heated and melted, so as to bond the piezoelectric device 100 to the substrate 160. When the paste of the solder 152 is heated, as illustrated in FIG. 5A, the solder 152 moves up the surface of the cutout-portion electrode 144, and reaches the outer surfaces of the end-portion electrode 146 and the cutout-portion facing region 170 in the framing portion 122 of the extraction electrode 130.

Here, solder is an alloy that mainly contains lead (Pb) and tin (Sn). Tin (Sn) as the main component of solder is known to have the property that tin (Sn) easily forms an alloy with gold (Au). Accordingly, when tin (Sn) and gold (Au) in contact with each other are heated, tin (Sn) erodes gold (Au). As illustrated in FIG. 5B, in the case where the solder 152 and the third layer 191C of the cutout-portion region 130A are in contact with each other, the solder 152 erodes gold (Au) constituting the third layer 191C as the layer on the surface of the cutout-portion region 130A and then moves forward in the direction of the excitation electrode 128.

In the conventional piezoelectric device, as just described, tin (Sn) of the solder reaches the excitation electrode of the piezoelectric vibrating piece via gold (Au) contained in the extraction electrode and erodes the excitation electrode. In some cases, this shifts the frequency of the piezoelectric vibrating piece or interferes with the oscillation of the piezoelectric vibrating piece.

In the piezoelectric device 100, the erosion preventing region 130B is formed in the extraction electrode 130. Accordingly, even when the solder 152 erodes the cutout-portion region 130A, it can be said that the erosion actually stops at the erosion preventing region 130B when the erosion reaches the erosion preventing region 130B formed of chrome (Cr). An alloy is less likely to be formed between: tin (Sn); and each of chrome (Cr), nickel (Ni), and nickel-tungsten (NiW) as the alloy of nickel (Ni) and tungsten (W), compared with the case of tin (Sn) and gold (Au). Even when heating is performed, the rate of erosion on chrome (Cr), nickel (Ni), and nickel-tungsten (NiW) by tin (Sn) is slow. Accordingly, the solder 152 does not reach the excitation-electrode connecting region 130C. This prevents the solder 152 from reaching the excitation electrode 128.

In the case where the solder 152 does not reach the excitation electrode 128 but erodes the connecting portion 126 and the vibrating portion 124 that are not directly secured to the base 140, the weight of the extraction electrode 130 formed in the connecting portion 126 and the vibrating portion 124 might vary. Accordingly, the frequency might vary. In the piezoelectric device 100, formation of the erosion preventing region 130B in the framing portion 122 prevents the solder 152 from eroding the connecting portion 126 and the vibrating portion 124. This is preferred.

In the above description, the erosion of the solder 152 from the outer surface of the cutout-portion region 130A has been described. However, the solder 152 might erode the cutout-portion region 130A from the end-portion electrode 146. The following description describes this point.

The gold (Au) layer is provided in the second layer 194B of the end-portion electrode 146B to be the surface of the end-portion electrode 146. Accordingly, when the solder 152 is heated, the solder 152 erodes the layer of gold (Au) and reaches the first layer 194A of the end-portion electrode 146B. Here, since the first layer 194A of the end-portion electrode 146B is the layer of nickel (Ni), the rate of erosion by the solder 152 becomes slow. However, the first layer 194A is, for example, 30 Å and is formed to be thin. Accordingly, the solder 152 might erode the first layer 194A and reach the end-portion electrode 146A.

Here, the third layer 193C that is the layer of the surface of the end-portion electrode 146A is the layer of gold (Au). Accordingly, the solder 152 erodes the third layer 193C and reaches the second layer 193B of the end-portion electrode 146A. Here, the second layer 193B and the first layer 193A are the layer of the alloy of nickel (Ni) and tungsten (W) and the layer of chrome (Cr), in which erosion by tin (Sn) is slow. However, the second layer 193B and the first layer 193A are each, for example, 30 Å and are formed to be thin. Accordingly, similarly to the case of the end-portion electrode 146B, the solder 152 might erode the end-portion electrode 146A and reach the extraction electrode 130.

Thus, the solder 152 might erode the end-portion electrode 146 and reach the extraction electrode 130 formed in the region 170 that faces the cutout portion 148 of the framing portion 122. However, even when the erosion by the solder 152 thus proceeds, it can be said that the erosion actually stops at the erosion preventing region 130B when the erosion by the solder 152 reaches the erosion preventing region 130B made of chrome (Cr). Accordingly, the solder 152 does not reach the excitation-electrode connecting region 130C.

The piezoelectric device 100 described above provides the following advantageous effects. The layers of gold (Au) are formed on the surfaces of the cutout-portion region 130A and the excitation-electrode connecting region 130C. However, in the region separating the cutout-portion region 130A and the excitation-electrode connecting region 130C form each other, the erosion preventing region 130B made of chrome (Cr) is formed.

Accordingly, even in the case where the piezoelectric device 100 is mounted on the substrate 160 by the solder 152 and the solder 152 erodes the cutout-portion region 130A, the erosion is stopped at the erosion preventing region 130B so as to avoid the state where the solder 152 reaches the excitation electrode 128. In particular, as illustrated in FIG. 3B, the erosion preventing region 130B is formed in the framing portion 122. Accordingly, this avoids the state where the solder 152 reaches the vibrating portion 124 and the connecting portion 126. Furthermore, this avoids the state where the solder 152 reaches the end portion on the vibrating portion 124 side in the framing portion 122.

For production of electronic equipment, the substrate 160 where the piezoelectric device 100 is mounted is sometimes heated one or more times. In this case, the erosion by the solder 152 is considered to proceed more. However, since the erosion preventing region 130B stops the erosion by the solder 152, the state where the solder 152 erodes the excitation-electrode connecting region 130C can be avoided. Also in the case where the layer of the alloy of nickel (Ni) and tungsten (W) is provided on the surface of the erosion preventing region 130B, similar effects can be obtained due to the slow rate of erosion on the alloy of nickel (Ni) and tungsten (W) by solder.

[Method for Manufacturing Piezoelectric Device 100]

Figure 6:
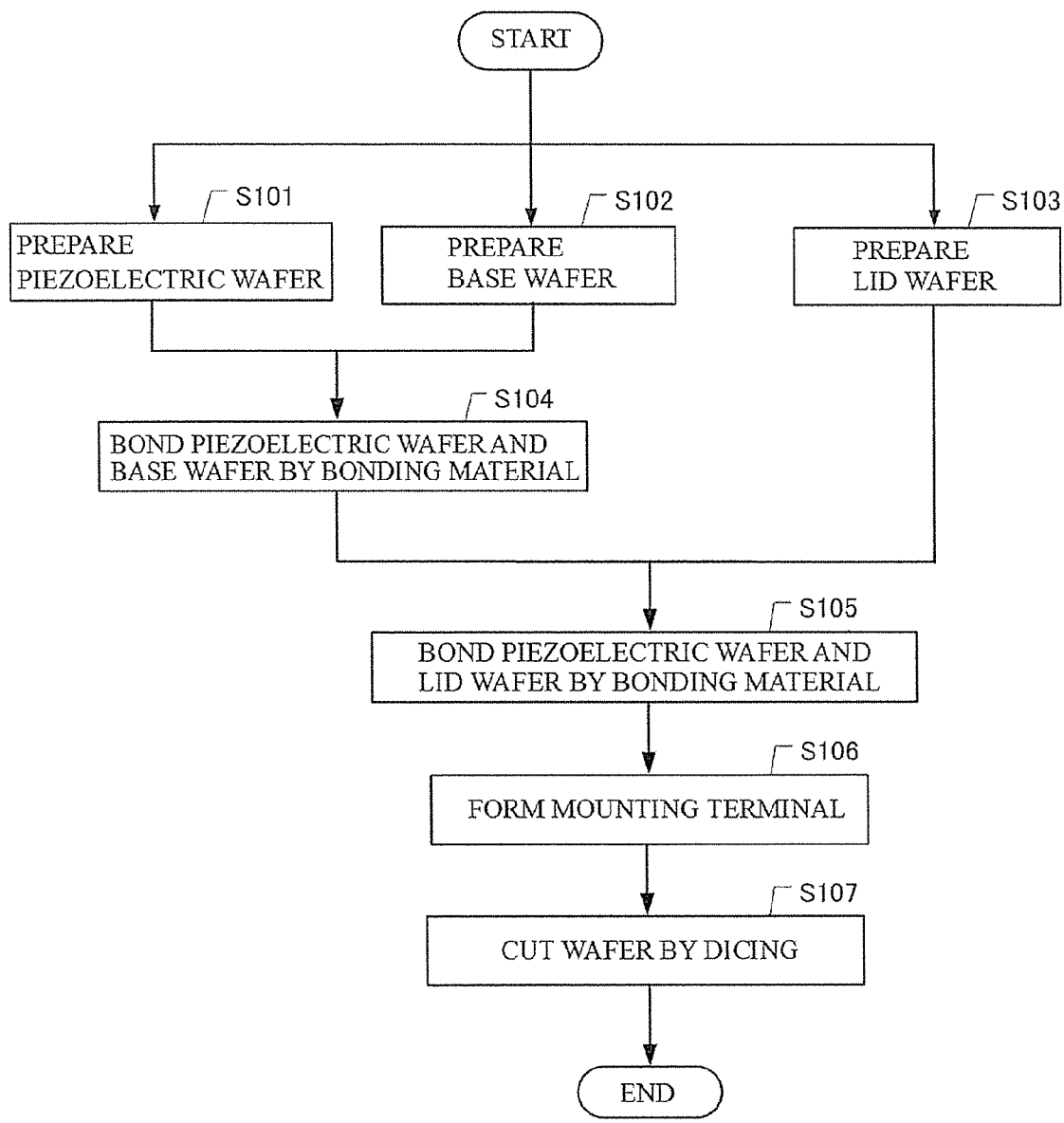
FIG. 6 is a flowchart illustrating a method for manufacturing the piezoelectric device 100.

FIG. 6 is a flowchart illustrating a method for manufacturing the piezoelectric device 100. Hereinafter, the method for manufacturing the piezoelectric device 100 will be described by referring to the flowchart of FIG. 6.

In step S101, a piezoelectric wafer W120 is prepared. Step S101 is a process for preparing a piezoelectric wafer. In the piezoelectric wafer W120, a plurality of the piezoelectric vibrating pieces 120 are formed.

Figure 7:
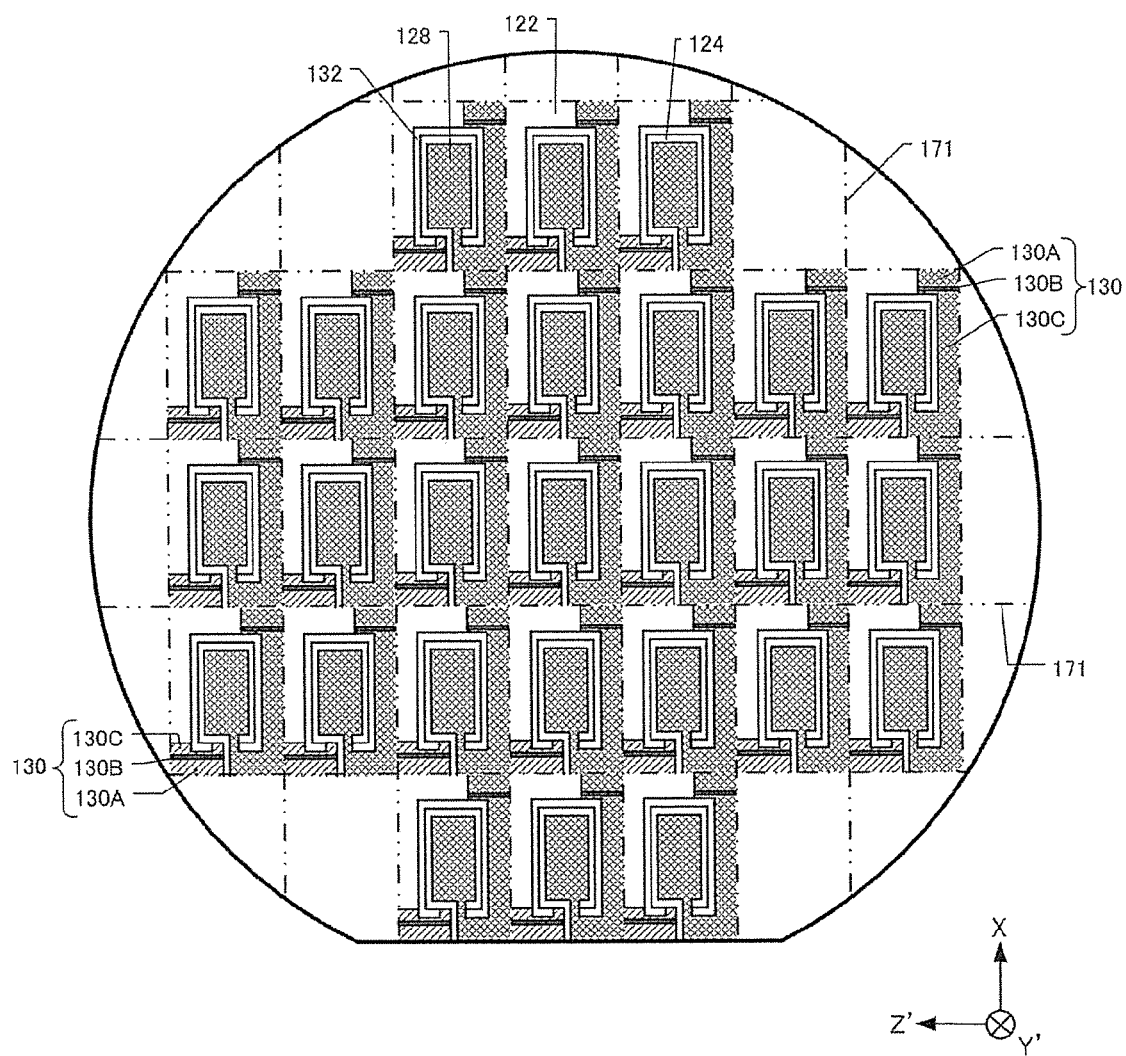
FIG. 7 is a plan view of a piezoelectric wafer W120.

FIG. 7 is a plan view of the piezoelectric wafer W120. In the piezoelectric wafer W120, a plurality of the piezoelectric vibrating pieces 120 are formed. At the boundary between the piezoelectric vibrating pieces 120 adjacent to each other, a scribe line 171 is illustrated. In each piezoelectric vibrating piece 120, the through groove 132 is formed, and the excitation electrodes 128 and the extraction electrodes 130 are formed.

In step S101, firstly, a bare wafer formed of a piezoelectric material is prepared. Since the piezoelectric material employs crystal in the piezoelectric device 100, the bare wafer to be prepared is a bare wafer of crystal. The bare wafer includes a plurality of virtual regions (framed-piezoelectric-vibrating-piece virtual region) to be the framed piezoelectric vibrating pieces 120. This framed-piezoelectric-vibrating-piece virtual region corresponds to one region surrounded by the scribe line 171 in FIG. 7.

Subsequently, the bare wafer is etched to form the outer shapes of the vibrating portion 124 and the connecting portion 126 for each framed-piezoelectric-vibrating-piece virtual region. Specifically, a penetration is made in the region surrounded by the framing portion 122, the connecting portion 126, and the vibrating portion 124. At this time, the vibrating portion 124 is set to have a predetermined thickness so as to adjust the frequency of the piezoelectric device 100 to a predetermined value.

Subsequently, the excitation electrodes 128 and the extraction electrodes 130 are formed on the etched bare wafer. Hereinafter, a description will be given of electrode formation with reference to FIG. 8A to FIG. 8C.

Figure 8A:
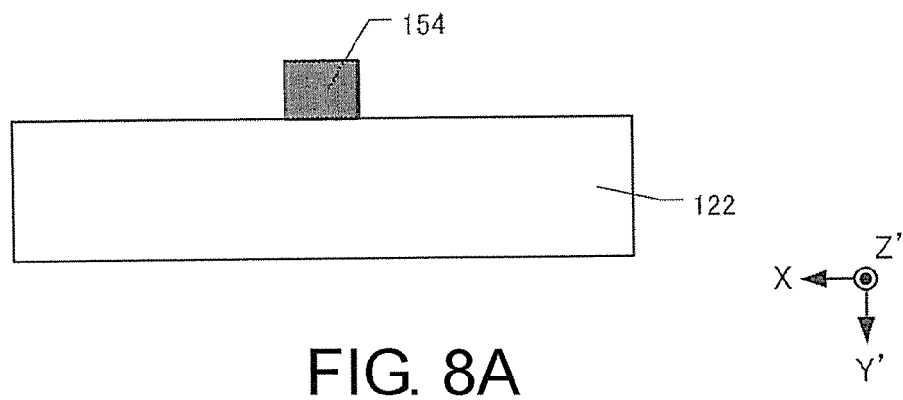
FIG. 8A is a partial cross-sectional view of a framing portion 122 of a bare wafer where a block 154 of a chrome (Cr) is formed.

FIG. 8A is a partial cross-sectional view of the framing portion 122 in the bare wafer where a block 154 of chrome (Cr) is formed. After the bare wafer is etched, a film of chrome (Cr) is formed by, for example, sputtering or evaporation on the entire surface at the −Y' axis side of the bare wafer. Subsequently, etching is performed to remove chrome (Cr) in the region other than the region where the erosion preventing region 130B is formed in the framed-piezoelectric-vibrating-piece virtual region. As a result, as illustrated in FIG. 8A, the block 154 of chrome (Cr) is formed in the region where the erosion preventing region 130B is formed in the framing portion 122.

Figure 8B:
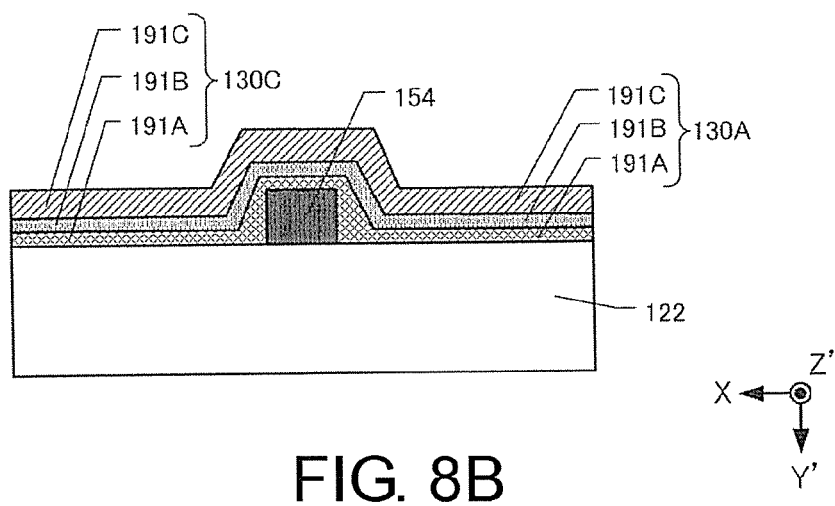
FIG. 8B is a partial cross-sectional view of the framing portion 122 of the piezoelectric wafer W120 where excitation electrodes 128 and extraction electrodes 130 are formed.

FIG. 8B is a partial cross-sectional view of the framing portion 122 in the piezoelectric wafer W120 where the excitation electrodes 128 and the extraction electrodes 130 are formed. The bare wafer where the block 154 of chrome (Cr) is formed is formed as the piezoelectric wafer W120 by forming the excitation electrode 128 and the extraction electrode 130. On the entire surfaces at the +Y'-axis side and at the −Y' axis side of the bare wafer where the block 154 of chrome (Cr) is formed in FIG. 8A, a layer of chrome (Cr), a layer of an alloy of nickel (Ni) and tungsten (W), and a layer of gold (Au) are formed sputtering, evaporation, or similar method in this order. These layers become the first layer 191A, the second layer 191B, and the third layer 191C of the extraction electrode 130. Subsequently, etching is performed to remove the layer of chrome (Cr), the layer of the alloy of nickel (Ni) and tungsten (W), and the layer of gold (Au) in the region excluding the excitation electrodes 128 and the extraction electrodes 130. Accordingly, the excitation electrodes 128 and the extraction electrode 130 are formed.

Figure 8C:
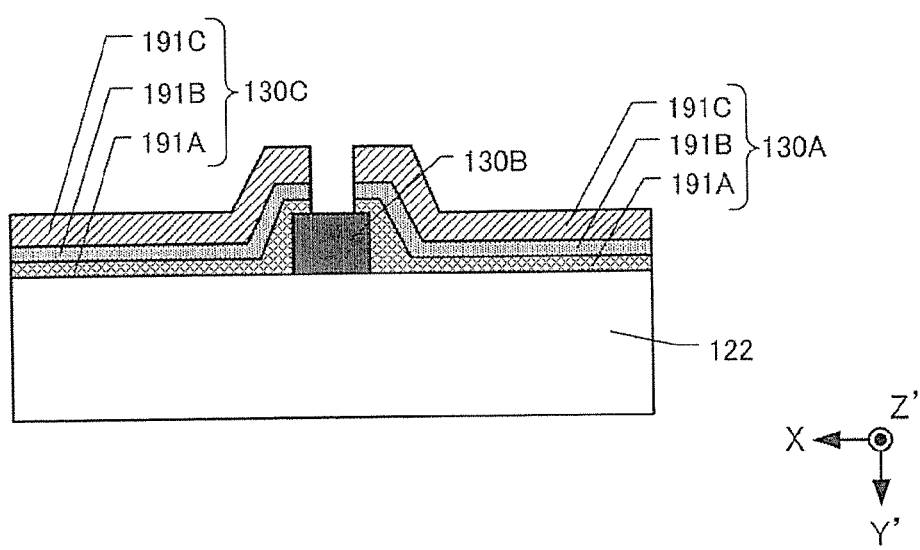
FIG. 8C is a partial cross-sectional view of the framing portion 122 of the piezoelectric wafer W120 where a gold (Au) layer of an erosion preventing region 130B is removed.

FIG. 8C is a partial cross-sectional view of the framing portion 122 in the piezoelectric wafer W120 where the gold (Au) layer of the erosion preventing region 130B is removed. In the state illustrated in FIG. 8B, the layer of gold (Au) is remained on the surface of the erosion preventing region 130B. Therefore, subsequently, etching is performed to remove the layer of gold (Au) formed on the surface of the erosion preventing region 130B. Here, the layer of the alloy of nickel (Ni) and tungsten (W) may be removed together with the layer of gold (Au) on the surface of the erosion preventing region 130B. In this case, the erosion preventing region 130B is formed of the layer of chrome (Cr) alone as illustrated in FIG. 5B.

Returning to FIG. 6, in step S102, the base wafer W140 is prepared. In the base wafer W140, a plurality of the bases 140 are formed. Step S102 is a process for preparing the base wafer W140.

Figure 9A:
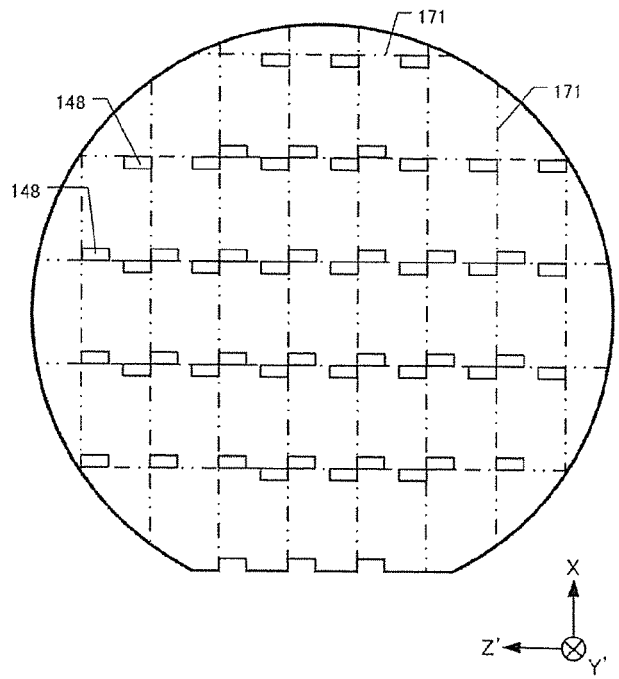
FIG. 9A is a plan view of a base wafer W140.

FIG. 9A is a plan view of the base wafer W140. In the base wafer W140, the plurality of the bases 140 are formed. At the boundary between the bases 140 adjacent to each other, the scribe line 171 is illustrated. The base wafer W140 is formed of a piezoelectric material such as crystal, glass, or similar material.

In step S102, firstly, a bare wafer formed of a piezoelectric material or similar material is prepared. In the piezoelectric device 100, the bare wafer to be prepared is a bare wafer of crystal. The bare wafer includes a plurality of virtual regions (base virtual regions) to be the bases 140. Subsequently, a penetration is made in the region to be the cutout portion 148 of the base virtual region by etching, so as to form the cutout portion 148.

In step S103, a lid wafer W110 is prepared. In the lid wafer W110, a plurality of the lids 110 are formed. Step S103 is a process for preparing the lid wafer W110.

Figure 9B:
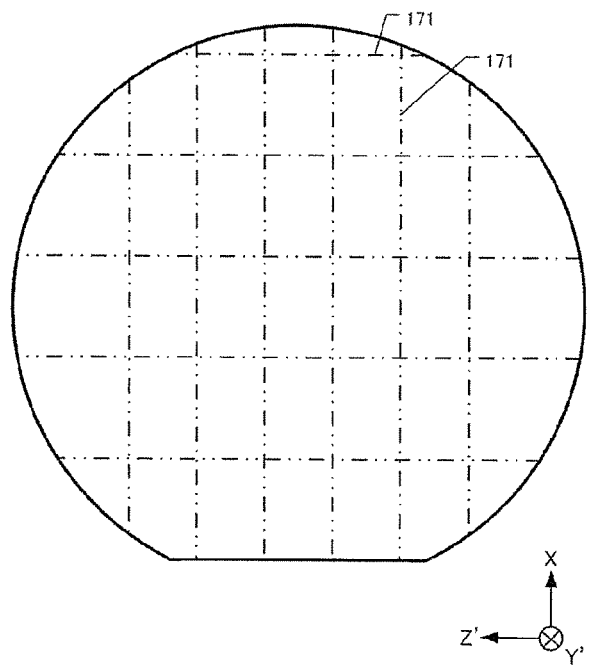
FIG. 9B is a plan view of a lid wafer W110.

FIG. 9B is a plan view of the lid wafer W110. In the lid wafer W110, the plurality of the lids 110 are formed. At the boundary between the lids 110 adjacent to each other, the scribe line 171 is illustrated. The lid wafer W110 is formed of a piezoelectric material such as crystal, glass, or similar material. In step S103, firstly, a bare wafer formed of a piezoelectric material or similar material is prepared. In the piezoelectric device 100, the bare wafer to be prepared is a bare wafer of crystal. The bare wafer includes a plurality of virtual regions (lid virtual regions) to be the lids 110.

In step S104, the piezoelectric wafer W120 and the base wafer W140 are bonded together by the bonding material 150. Step S104 is a process for bonding the piezoelectric wafer and the base wafer together. In step S104, the surface at the −Y'-axis side of the piezoelectric wafer W120 and the surface at the +Y'-axis side of the base wafer W140 are bonded together via the bonding material 150 such that the framed-piezoelectric-vibrating-piece virtual region and the base virtual region face each other.

In step S105, the piezoelectric wafer W120 and the lid wafer W110 are bonded together by the bonding material 151. Step S105 is a process for bonding the piezoelectric wafer and the lid wafer together. In step S105, the surface at the +Y'-axis side of the piezoelectric wafer W120 and the surface at the −Y'-axis side of the lid wafer W110 are bonded together via the bonding material 151 such that the framed-piezoelectric-vibrating-piece virtual region and the lid virtual region face each other. Accordingly, the laminated wafer is formed.

In step S106, the mounting terminal 142 is formed. Step S106 is a process for forming the mounting terminal. From the surface on the base wafer W140 side, which is the surface at the −Y'-axis side of the laminated wafer, a layer of chrome (Cr), a layer of an alloy of nickel (Ni) and tungsten (W), and a layer of gold (Au) are sequentially formed by sputtering, evaporation, or similar method, so as to form the mounting terminal 142A, the cutout-portion electrode 144A, and the end-portion electrode 146A illustrated in FIG. 5A. Subsequently, electroless plating is performed on the surfaces of the mounting terminal 142A, the cutout-portion electrode 144A, and the end-portion electrode 146A to sequentially form a layer of nickel (Ni) and a layer of gold (Au), so as to form the mounting terminal 142B, the cutout-portion electrode 144B, and the end-portion electrode 146B.

In step S107, the laminated wafer is cut by dicing. Step S107 is a dicing process. The laminated wafer is diced along the scribe line 171, so as to form the piezoelectric device 100 as an individual chip.

[Formation Example of Erosion Preventing Region 130B]

The erosion preventing region 130B may be formed by a method different from the method described in FIG. 8A to FIG. 8C. The following description describes a method for forming the erosion preventing region 130B using a method different from the method described in FIG. 8A to FIG. 8C. Here, a piezoelectric device 100a will be described in FIG. 10A to FIG. 10C, and a piezoelectric device 100b will be described in FIG. 10A and FIG. 11A to FIG. 11C. The piezoelectric devices 100a and 100b differ from the piezoelectric device 100 only in the configuration of the erosion preventing region 130B, and are otherwise similar to the piezoelectric device 100.

Figure 10A:
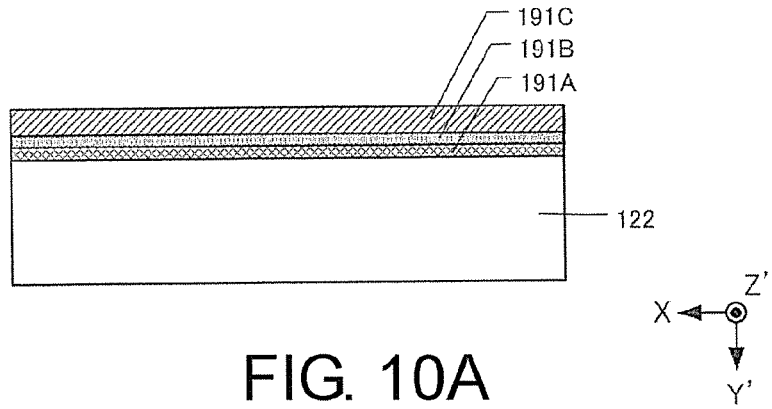
FIG. 10A is a partial cross-sectional view of the framing portion 122 of the piezoelectric wafer W120 where the excitation electrodes 128 and the extraction electrodes 130 are formed.

FIG. 10A is a partial cross-sectional view of the framing portion 122 in the piezoelectric wafer W120 where the excitation electrode 128 and the extraction electrode 130 are formed. FIG. 10A illustrates a partial cross-sectional view of the framing portion 122 of the piezoelectric wafer W120 where the excitation electrode 128 and the extraction electrode 130 are formed in the bare wafer etched in step S101 in FIG. 6. In FIG. 10A, unlike FIG. 8B, the block 154 of chrome (Cr) is not formed.

Figure 10B:
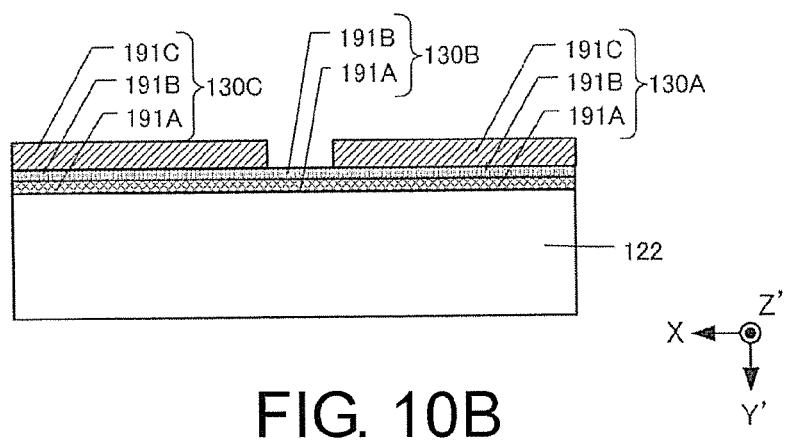
FIG. 10B is a partial cross-sectional view of the framing portion 122 of the piezoelectric wafer W120 where a gold (Au) layer of the erosion preventing region 130B is removed.

FIG. 10B is a partial cross-sectional view of the framing portion 122 of the piezoelectric wafer W120 where the gold (Au) layer of the erosion preventing region 130B is removed. In the erosion preventing region 130B in FIG. 10B, the third layer 191C is removed by etching. That is, the erosion preventing region 130B is formed of the first layer 191A and the second layer 191B.

Figure 10C:
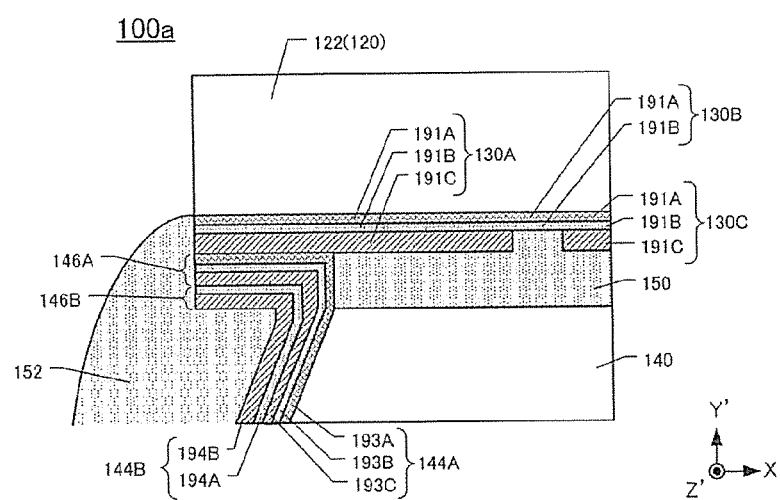

FIG. 10C is a partially enlarged cross-sectional view of the piezoelectric device 100a. FIG. 10C is a cross-sectional view of the portion corresponding to FIG. 5B. In the piezoelectric device 100a, the bonding material 150 gets into the space where the third layer 191C of the erosion preventing region 130B is formed in the piezoelectric device 100a. Accordingly, even when the solder 152 erodes the cutout-portion region 130A, the first layer 191A and the second layer 191B are less likely to be eroded by the solder 152 and thus the bonding material 150 is not eroded by the solder 152. This allows preventing the state where the solder 152 erodes the excitation-electrode connecting region 130C.

Figure 11A:
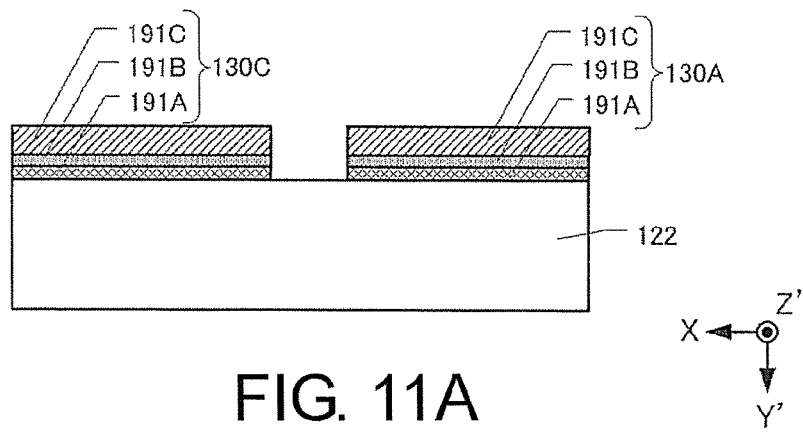
FIG. 11A is a partial cross-sectional view of the framing portion 122 of the piezoelectric wafer W120 where a third layer 191C is removed from a first layer 191A in the erosion preventing region 130B.

FIG. 11A is a partial cross-sectional view of the framing portion 122 of the piezoelectric wafer W120 where the third layer 191C is removed from the first layer 191A in the erosion preventing region 130B. In the piezoelectric device 100b, starting from the state in FIG. 10A, the third layer 191C is removed from the first layer 191A of the erosion preventing region 130B by etching or similar method.

Figure 11B:
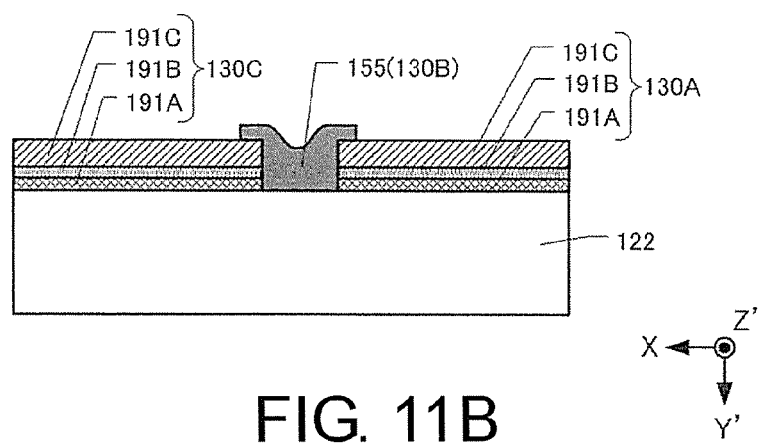
FIG. 11B is a partial cross-sectional view of the framing portion 122 of the piezoelectric wafer W120 where a chromium (Cr) layer 155 is formed in the erosion preventing region 130B.

FIG. 11B is a partial cross-sectional view of the framing portion 122 of the piezoelectric wafer W120 where a chromium (Cr) layer 155 is formed in the erosion preventing region 130B. In the piezoelectric device 100b, after FIG. 11A, the chromium (Cr) layer 155 is formed by sputtering, evaporation, or similar method in the erosion preventing region 130B.

Figure 11C:
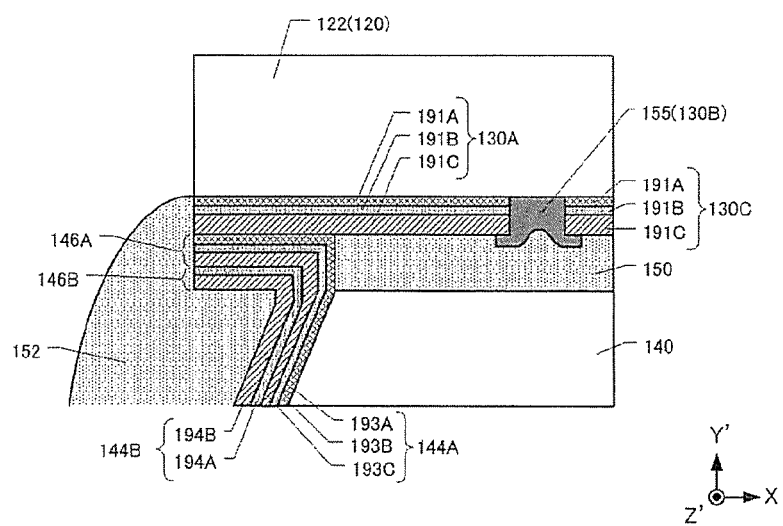
FIG. 11C is a partially enlarged cross-sectional view of a piezoelectric device 100b.

FIG. 11C is a partially enlarged cross-sectional view of the piezoelectric device 100b. FIG. 11C is a partial cross-sectional view of the portion corresponding to FIG. 5B. In the piezoelectric device 100b, the erosion preventing region 130B is formed only of the chromium (Cr) layer 155 that is less likely to be eroded by the solder 152. This prevents the solder 152 from eroding the excitation-electrode connecting region 130C even when the cutout-portion region 130A is eroded by the solder 152.

Second Embodiment

The piezoelectric device 100 is the three-layered piezoelectric device where the base 140, the piezoelectric vibrating piece 120, and the lid 110 are laminated. Similarly, in a two-layered piezoelectric device where a base is directly bonded to a lid, there occurs a problem that solder erodes an excitation electrode. Accordingly, also in the two-layered piezoelectric device, an erosion preventing region for preventing the erosion by solder may be formed in the electrode. The following description describes a two-layered piezoelectric device 200 where the erosion preventing region is formed. Here, in the following description, like reference numerals designate corresponding or identical elements throughout the first embodiment and the second embodiment, and therefore such elements will not be further elaborated here.

[Overall Configuration of Piezoelectric Device 200]

Figure 12:
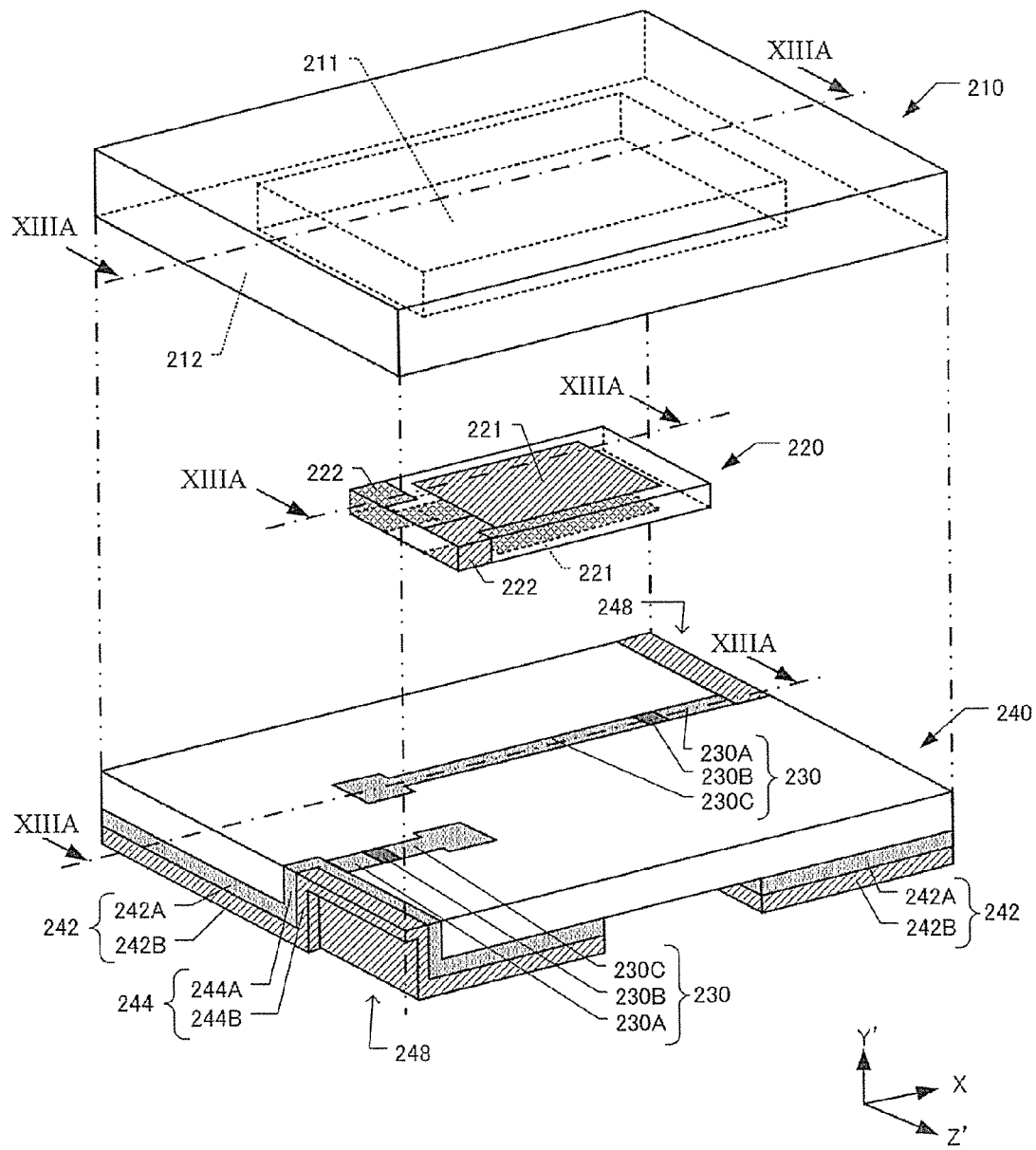
FIG. 12 is an exploded perspective view of a piezoelectric device 200.

FIG. 12 is an exploded perspective view of the piezoelectric device 200. The piezoelectric device 200 is constituted mainly of a piezoelectric vibrating piece 220 (which is also referred to as excitation portion), a base 240, and a lid 210. In the piezoelectric device 200, the lid 210 and the base 240 are formed using, for example, crystal, glass material, or similar material as base material. The piezoelectric vibrating piece 220 employs, for example, an AT-cut quartz-crystal vibrating piece.

In the piezoelectric device 200, the piezoelectric vibrating piece 220 is placed on the surface at the +Y'-axis side of the base 240. Additionally, the lid 210 is bonded to the +Y'-axis side of the base 240 to seal the piezoelectric vibrating piece 220 so as to form the piezoelectric device 200.

In the piezoelectric vibrating piece 220, excitation electrodes 221 are formed on principal surfaces at the +Y'-axis side and at the −Y' axis side. From the respective excitation electrodes 221, extraction electrodes 222 are formed to be extracted in the −X-axis direction. The extraction electrode 222 connected to the excitation electrode 221 formed on the −Y' axis side is extracted to the end at the −X-axis side and the −Z'-axis side on the surface at the −Y'-axis side, and is additionally extracted to the surface at the +Y'-axis side via the side surface at the −Z'-axis side.

The extraction electrode 222 connected to the excitation electrode 221 formed at the +Y'-axis side is extracted to the end at the −X-axis side and the +Z-axis side on the surface at the −Y'-axis side, and is additionally extracted to the surface at the −Y'-axis side via the side surface at the +Z-axis side. The electrodes such as the excitation electrode 221 and the extraction electrode 222 formed in the piezoelectric vibrating piece 220 are formed by, for example, forming a chromium (Cr) layer in the piezoelectric vibrating piece 220 and forming a gold (Au) layer on the chromium (Cr) layer.

In the lid 210, a depressed portion 211 depressed to the +Y'-axis side is formed on the surface at the −Y'-axis side. In the peripheral area of the depressed portion 211, a bonding surface 212 is formed. The lid 210 is bonded to the base 240 on the bonding surface 212.

In the base 240, at the corner of the +Z-axis side on the −X-axis side and at the corner of the −Z'-axis side on the +X-axis side, cutout portions 248 are formed by cutting out the corner of the base 240. On the surface at the +Y'-axis side of the base 240, a pair of connecting electrodes 230 (which is also referred to as extraction electrode) to be electrically connected to the extraction electrodes 222 of the piezoelectric vibrating piece 220 are formed. In the cutout portion 248, a cutout-portion electrode 244 is formed. On the surface at the −Y'-axis side of the base 240, mounting terminals 242 are formed.

The connecting electrode 230 (which is also referred to as extraction electrode) is formed of a cutout-portion region 230A connected to the cutout-portion electrode 244, an excitation-electrode connecting region 230C, and an erosion preventing region 230B formed between the cutout-portion region 230A and the excitation-electrode connecting region 230C. The excitation-electrode connecting region 230C is electrically connected to the excitation electrode by placing the piezoelectric vibrating piece via a conductive adhesive. The mounting terminal 242 is formed of a mounting terminal 242A formed on the surface of the base material of the base 240 and a mounting terminal 242B formed on the surface of the mounting terminal 242A. The cutout-portion electrode 244 is formed of a cutout-portion electrode 244A formed on the surface of the base material of the base 240 and a cutout-portion electrode 244B formed on the surface of the cutout-portion electrode 244A.

Figure 13A:
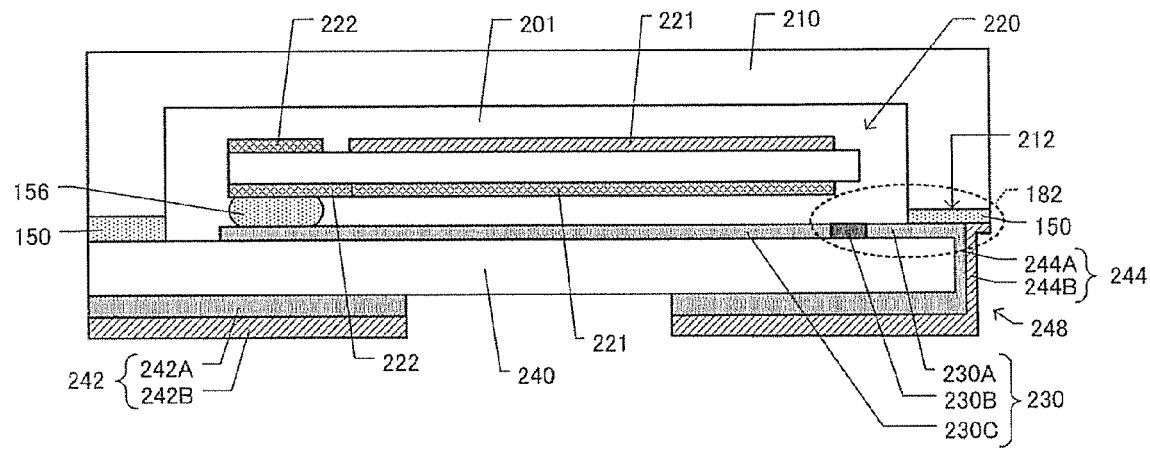
FIG. 13A is a cross-sectional view taken along the line XIIIA-XIIIA in FIG. 12.

FIG. 13A is a cross-sectional view taken along the line XIIIA-XIIIA in FIG. 12. The lid 210 is bonded to the base 240 via the bonding material 150 so as to form a cavity 201 sealed inside of the piezoelectric device 200. In the piezoelectric device 200, the extraction electrode 222 is connected to the excitation-electrode connecting region 230C via a conductive adhesive 156 so as to place the piezoelectric vibrating piece 220 in the cavity 201.

The connecting electrode 230 (which is also referred to as extraction electrode), the cutout-portion electrode 244A, and the mounting terminal 242A, which are formed in the base 240, are formed by sputtering, evaporation, or similar method before the base 240 and the lid 210 are bonded together. The cutout-portion electrode 244B and the mounting terminal 242B are formed by electroless plating after the base 240 and the lid 210 are bonded together.

Figure 13B:
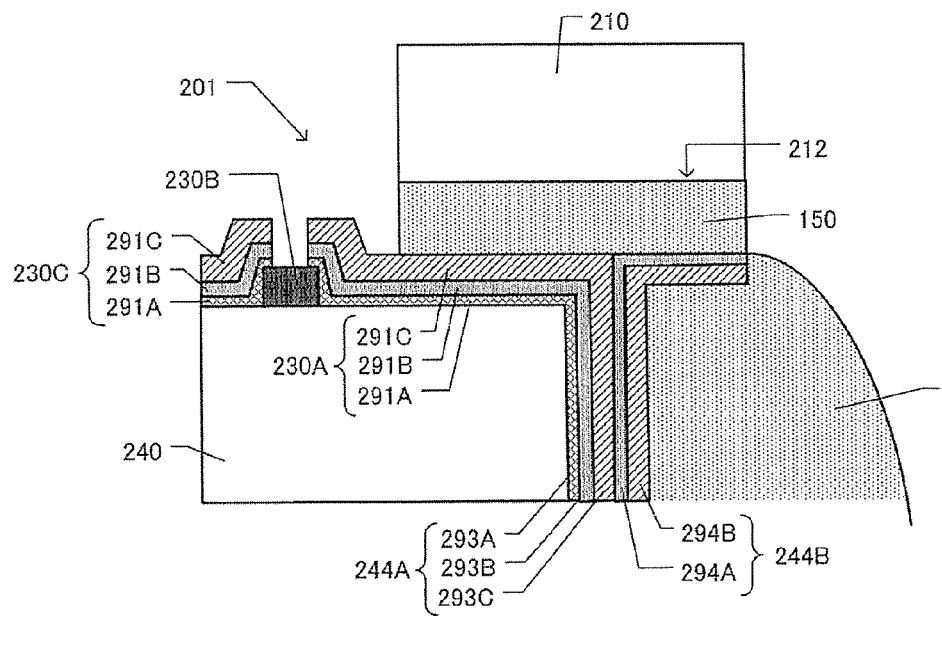
FIG. 13B is an enlarged view of a region enclosed by a dotted line 182 in FIG. 13A.

FIG. 13B is an enlarged view of a region enclosed by a dotted line 182 in FIG. 13A. FIG. 13B illustrates an enlarged view in the case where the piezoelectric device 200 is bonded to the substrate 160 by the solder 152.

The cutout-portion region 230A and the excitation-electrode connecting region 230C in the connecting electrode 230 (which is also referred to as extraction electrode) are formed of a first layer 291A formed on the surface of the base material of the base 240, a second layer 291B formed on the surface of the first layer 291A, and a third layer 291C formed on the surface of the second layer 291B. The cutout-portion electrode 244A is formed of a first layer 293A formed on the surface of the base material of the base 240, a second layer 293B formed on the surface of the first layer 293A, and a third layer 293C formed on the surface of the second layer 293B.

The first layer 291A of the cutout-portion region 230A and the first layer 293A of the cutout-portion electrode 244A are integrally formed as a layer of chrome (Cr). The second layer 291B of the cutout-portion region 230A and the second layer 293B of the cutout-portion electrode 244A are integrally formed as a layer of an alloy of nickel (Ni) and tungsten (W). The third layer 291C of the cutout-portion region 230A and the third layer 293C of the cutout-portion electrode 244A are integrally formed as a layer of gold (Au). Additionally, the erosion preventing region 230B are formed of chrome (Cr) similarly to the erosion preventing region 130B in FIG. 5B.

The cutout-portion electrode 244B is formed by a first layer 294A formed on the surface of the cutout-portion electrode 244A and a second layer 294B formed on the surface of the first layer 294A. The first layer 294A is a layer of nickel (Ni), and the second layer 294B is a layer of gold (Au).

When the solder 152 is heated, the solder 152 erodes the second layer 294B as the layer of gold (Au) and reaches the first layer 294A of the cutout-portion electrode 244B. Here, since the first layer 294A of the cutout-portion electrode 244B is the layer of nickel (Ni), the rate of erosion by the solder 152 becomes slow. However, the first layer 294A is, for example, 30 Å and is formed to be thin. Accordingly, the solder 152 might erode the first layer 294A and reach the cutout-portion electrode 244A.

The solder 152 that have reached the cutout-portion electrode 244A reaches the conductive adhesive 156. The conductive adhesive is constituted mainly of a binder for fixing the piezoelectric vibrating piece and a conductive filler for providing electrical conductivity. The conductive filler is constituted of for example, particles of silver (Ag). Since tin (Sn) contained in the solder 152 also erodes silver (Ag), the solder 152 might reach the extraction electrode 222 and the excitation electrode 221 in the piezoelectric vibrating piece 220 via the conductive adhesive 156.

In the piezoelectric device 200, formation of the erosion preventing region 230B in the connecting electrode 230 (which is also referred to as extraction electrode) prevents the solder 152 from reaching the excitation-electrode connecting region 230C. This prevents the solder 152 from reaching the piezoelectric vibrating piece 220.

While in FIG. 13B the erosion preventing region 230B is formed to be exposed inside the cavity 201, the erosion preventing region 230B may be formed at the −Y′ axis side of the bonding material 150. Additionally, the connecting electrode 230 (which is also referred to as extraction electrode) may be formed only of the excitation-electrode connecting region 230C and the erosion preventing region 230B without forming the cutout-portion region 230A. In this case, the erosion preventing region 230B is connected to the cutout-portion electrode 244A. Furthermore, the erosion preventing region 230B can be formed in various shapes and configurations similarly to the erosion preventing region 130B described in the first embodiment.

Representative embodiments are described in detail above; however, as will be evident to those skilled in the relevant art, this disclosure may be changed or modified in various ways within its technical scope.

For example, in the above-described embodiments, the cutout-portion region and the excitation-electrode connecting region in the extraction electrode and the connecting electrode (which is also referred to as extraction electrode) are each formed of the first layer as the layer of chrome (Cr), the second layer as the layer of the alloy of nickel (Ni) and tungsten (W), and the third layer as the layer of gold (Au). However, another metal layer may be formed instead of the first layer and the second layer. Specifically, it is possible to form a layer using the metal of the third layer and a metal that ensures certain bonding strength with the piezoelectric material constituting the piezoelectric vibrating piece.

In the above-described embodiments, the cutout-portion region and the excitation-electrode connecting region in the extraction electrode and the connecting electrode (which is also referred to as extraction electrode) and the third layer as the layer of the surface of the excitation electrode are made of gold (Au). However, instead of gold (Au), it is possible to use silver (Ag) and an alloy of gold (Au), silver (Ag), and palladium (Pd). Similarly to gold (Au), the erosion on silver (Ag) by the solder 152 easily proceeds. However, as described above, the erosion is stopped at the erosion preventing region of the extraction electrode and the connecting electrode (which is also referred to as extraction electrode).

In the first embodiment, the erosion preventing region 130B is formed in the framing portion 122. However, the formation portion of the erosion preventing region 130B is not limited to this portion, and the erosion preventing region 130B may be formed, for example, in the connecting portion 126. Also in this case, the erosion by the solder 152 is stopped at the erosion preventing region 130B. This allows avoiding the state where the solder 152 erodes the vibrating portion 124.

A part of the erosion preventing region 130B may overlap with the cutout-portion facing region 170. Also in this case, insofar as the erosion preventing region 130B extends to the region separating the cutout-portion facing region 170 and the excitation-electrode connecting region 130C, the state where the solder 152 erodes the excitation electrode 128 can be prevented.

While in the above-described embodiments the vibrating portion is the rectangular shape, another shape such as a tuning-fork shape, an oval shape, and a circular shape is possible. Additionally, while the piezoelectric vibrating piece is the AT-cut crystal, a Z-cut crystal, a BT-cut crystal, or similar crystal may be used. Additionally, while the piezoelectric devices 100 and 200 are the crystal units, a piezoelectric oscillator mounted with an IC including an oscillator circuit may be used. Additionally, while the piezoelectric vibrating pieces 120 and 220 are formed of crystal, a piezoelectric material other than crystal, for example, lithium tantalite, lithium niobate, or piezoelectric ceramic may be used.

In a piezoelectric device of a second aspect of this disclosure according to the piezoelectric device of the first aspect, the erosion preventing region is formed in the framing portion.

A piezoelectric device of a third aspect of this disclosure according to the piezoelectric device of the first aspect or the second aspect includes a piezoelectric vibrating piece and a base. The piezoelectric vibrating piece is formed of a piezoelectric material. The piezoelectric vibrating piece includes: excitation electrodes formed on both principal surfaces; and extraction electrodes extracted from the excitation electrodes. The base includes: a cutout portion formed on a side surface; a connecting electrode formed to be electrically connected to the extraction electrode on a principal surface where the piezoelectric vibrating piece is placed; a mounting terminal formed on a principal surface on an opposite side of the principal surface where the piezoelectric vibrating piece is placed; and a cutout-portion electrode formed in the cutout portion to be connected to the connecting electrode and the mounting terminal. The connecting electrode includes: a cutout-portion region connected to the cutout-portion electrode; an excitation-electrode connecting region electrically connected to the excitation electrode via the extraction electrode; and an erosion preventing region that is for preventing erosion by solder and formed between the cutout-portion region and the excitation-electrode connecting region. The connecting electrode in the erosion preventing region is formed without containing gold (Au) and silver (Ag), and the connecting electrodes in the cutout-portion region and the excitation-electrode connecting region are formed containing at least one of gold (Au) and silver (Ag).

In a piezoelectric device of a fourth aspect of this disclosure according to the piezoelectric devices of the first aspect to the third aspect, the erosion preventing region is formed by two layers of: one of a chromium (Cr) layer, a nickel (Ni) layer, a tungsten (W) layer, a molybdenum (Mo) layer, a nickel-tungsten (NiW) layer, a titanium (Ti) layer, and a chromium (Cr) layer; and a nickel-tungsten (NiW) layer. A gold (Au) layer or a silver (Ag) layer is formed on surfaces in the cutout-portion region and the excitation-electrode connecting region.

A piezoelectric device of a fifth aspect of this disclosure according to the piezoelectric device of the third aspect further includes a lid that covers the piezoelectric vibrating piece. The erosion preventing region is formed of a non-conductive bonding material that bonds the lid and the base together.

In a piezoelectric device of a sixth aspect of this disclosure according to the piezoelectric device of the first aspect or the second aspect, the erosion preventing region is formed of a non-conductive bonding material that bonds the base and the framing portion of the piezoelectric vibrating piece.

In a piezoelectric device of a seventh aspect of this disclosure according to the piezoelectric devices of the first aspect to the sixth aspect, the cutout-portion region and the excitation-electrode connecting region are each formed of: a chromium (Cr) layer; a nickel-tungsten (NiW) layer formed on a surface of the chromium (Cr) layer; and a gold (Au) layer formed on a surface of the nickel-tungsten (NiW) layer.

The piezoelectric device of this disclosure allows avoiding the state where the solder erodes the excitation electrode in the case where the piezoelectric device is mounted on a substrate with solder.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device, comprising:
    a piezoelectric vibrating piece formed of a piezoelectric material, the piezoelectric vibrating piece including: an excitation portion, and excitation electrodes formed on both principal surfaces of the excitation portion; and
    extraction electrodes, being extracted from the excitation electrodes; and
    a base that includes:
        a cutout portion, being formed on a side surface of the base;
        a mounting terminal, being formed on a principal surface at an opposite side of the principal surface where the piezoelectric vibrating piece is placed; and
        a cutout-portion electrode, being formed in the cutout portion, and the cutout-portion electrode connecting the extraction electrodes to the mounting terminal, wherein
    the extraction electrode includes:
        a cutout-portion region, being connected to the cutout-portion electrode;
        an excitation-electrode connecting region, being connected to the excitation electrode; and
        an erosion preventing region, being disposed between the cutout-portion region and the excitation-electrode connecting region to prevent erosion by solder, and
    the extraction electrode in the erosion preventing region is formed without containing gold (Au) and silver (Ag), and the extraction electrodes in the cutout-portion region and the excitation-electrode connecting region are formed containing at least one of gold (Au) and silver (Ag).

2. The piezoelectric device according to claim 1, wherein the piezoelectric vibrating piece further includes:
    a framing portion that surrounds a peripheral area of the excitation portion; and
    a connecting portion that connects the excitation portion and the framing portion together, wherein
    the extraction electrodes are disposed along the framing portion, and
    the base is bonded to the framing portion with a bonding material.

3. The piezoelectric device according to claim 2, wherein the erosion preventing region is formed in the framing portion.

4. The piezoelectric device according to claim 1, wherein the extraction electrodes are disposed along a principal surface of the base where the piezoelectric vibrating piece is placed.

5. The piezoelectric device according to claim 1, wherein the erosion preventing region is formed by:
    a layer of a chromium (Cr) layer, a nickel (Ni) layer, a tungsten (W) layer, a molybdenum (Mo) layer, a nickel-tungsten (NiW) layer, or a titanium (Ti) layer; or
    two layers of a chromium (Cr) layer and a nickel-tungsten (NiW) layer, and
    a gold (Au) layer or a silver (Ag) layer is formed on surfaces in the cutout-portion region and the excitation-electrode connecting region.

6. The piezoelectric device according to claim 4, further comprising:
    a lid that covers the piezoelectric vibrating piece, wherein
    the erosion preventing region is formed of a non-conductive bonding material that bonds the lid and the base together.

7. The piezoelectric device according to claim 2, wherein the erosion preventing region is formed of a non-conductive bonding material that bonds the base and the framing portion of the piezoelectric vibrating piece.

8. The piezoelectric device according to claim 1, wherein the cutout-portion region and the excitation-electrode connecting region are each formed of: a chromium (Cr) layer; a nickel-tungsten (NiW) layer to be formed on a surface of the chromium (Cr) layer; and a gold (Au) layer to be formed on a surface of the nickel-tungsten (NiW) layer.

* * * * *